United States Patent
Solomon

(10) Patent No.: US 7,772,880 B2
(45) Date of Patent: Aug. 10, 2010

(54) REPROGRAMMABLE THREE DIMENSIONAL INTELLIGENT SYSTEM ON A CHIP

(76) Inventor: Neal Solomon, P.O. Box 21297, Oakland, CA (US) 94620

(*) Notice: Subject to any disclaimer, the term of this patent is extended or adjusted under 35 U.S.C. 154(b) by 13 days.

(21) Appl. No.: 12/283,452

(22) Filed: Sep. 12, 2008

(65) Prior Publication Data

US 2009/0066366 A1      Mar. 12, 2009

Related U.S. Application Data

(60) Provisional application No. 60/993,711, filed on Sep. 12, 2007.

(51) Int. Cl.
*H03K 19/173*      (2006.01)

(52) U.S. Cl. .......................................... 326/38; 326/41
(58) Field of Classification Search .............. 326/37–41
See application file for complete search history.

(56) References Cited

U.S. PATENT DOCUMENTS

| 7,402,897 | B2 * | 7/2008 | Leedy ........................ 257/678 |
| 2009/0039918 | A1 * | 2/2009 | Madurawe .................... 326/41 |

* cited by examiner

*Primary Examiner*—Don P Le

(57) ABSTRACT

A high performance 3D semiconductor is described with cubic dimensional multi-node reprogrammable components for multi-functionality and intelligent behaviors. The system is modeled with dynamic EDA techniques. Applications of the intelligent SoC are specified, particularly embedded, multifunctional, DSP and high-performance computing applications.

6 Claims, 28 Drawing Sheets

○ Microprocessor in corners (8)
□ ASIC in sides (12)
△ FPGA's (14)

FIG. 18

| 1800 | Planar transistor | Planar 2-gate transistor | 3D FISFET | 3D tri-gate transistor |
|---|---|---|---|---|
| CMOS | | | | |
| 3D Memory SRAM DRAM ADRAM | | ✓ | ✓ | ✓ |
| Micro-processor | | ✓ | IBM | Intel |
| FPGA | ✓ | | ⊙ | ⊙ |
| ASIC | ✓ | | | |

FIG. 19

| 1900 | Virtual layers stacked | | Stacked layers | |
|---|---|---|---|---|
| | | | | |
| Tiles | 22 X 22 → 484 | 25 X 25 → 625 | 39 X 39 → 1521 | 70 X 70 → 4900 |
| Virtual layers | 484 X 484 → 234,256 | 625 X 625 → 390,625 | 1521 X 1521 → 2.31 M | 4700 X 4700 → 24 M |
| Real layer @ node / Total layers | 9 virtual CMOS layer X 12 layers → 108 | 9 virtual CMOS layer X 12 layers → 108 | 12 | 12 |
| Total transistors @ node | 25.3 M @ node X 35 nodes | 42.2 M @ node X 35 nodes | 27.76 M X 35 nodes | 288 M X 35 nodes |
| Total transistors | 885 M total | 1.476 B | 971.65 M | 10.08 B |

FIG. 20

| 2000 | Economy version (small) | Standard version (medium) | High performance version (large) |
|---|---|---|---|
| Apps. | embedded controllers | DSP | modeling / scientific |
| gen 1<br>(45 nM) | | | |
| (2 X power)<br>gen 2<br>2011<br>(32 nM) | | | |
| (2 X power)<br>gen 3<br>2013<br>(22 nM) | | | |
| (2 X power)<br>gen 4<br>2015<br>(16 nM) | | | |

FIG. 35
FIG. 36
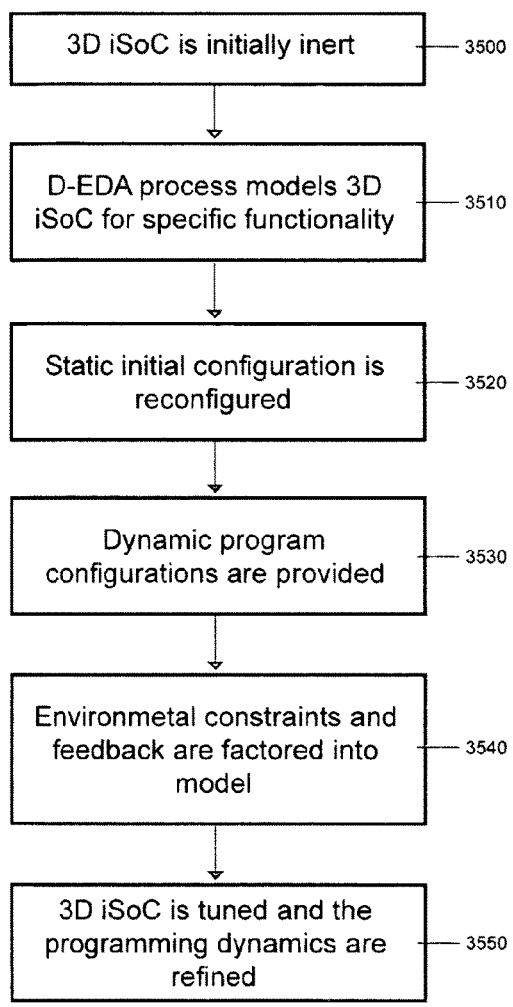
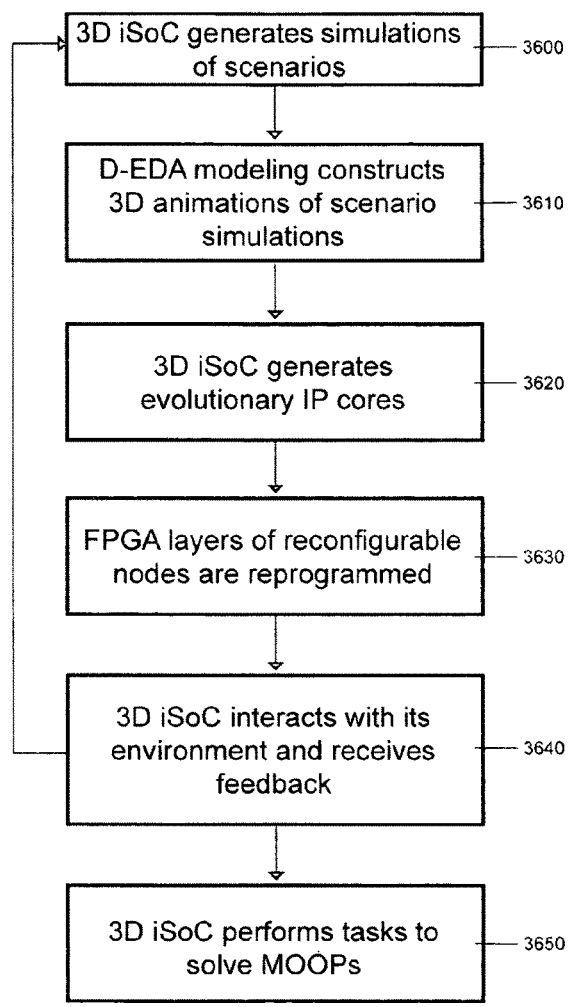

REPROGRAMMABLE THREE DIMENSIONAL INTELLIGENT SYSTEM ON A CHIP

CROSS-REFERENCES TO RELATED APPLICATIONS

The present application claims the benefit of priority under U.S.C. §119 from U.S. Provisional Patent Application Ser. No. 60/993,711 filed on Sep. 12, 2007, the disclosure of which is hereby incorporated by reference in their entirety for all purposes.

FIELD OF INVENTION

The invention involves system on chip (SoC) and network on chip (NoC) semiconductor technology. The system is a three dimensional (3D) super computer on a chip (SCOC) and involves multiple processors on silicon (MPSOC) and a system on a programmable chip (SOPC). Components of the present invention involve micro-electro-mechanical systems (MEMS) and nano-electro-mechanical systems (NEMS). In particular, the reconfigurable components of the SoC are adaptive and represent evolvable hardware (EHW), consisting of field programmable gate array (FPGA) and complex programmable logic device (CPLD) architectures. The system has elements of intelligent microsystems that signify bio-inspired computing behaviors, exemplified in hardware-software interactivity. Because the system is a hybrid heterostructure semiconductor device that incorporates EHW, intelligent behaviors and synthetic computer interconnect network fabrics, the system is exemplar of polymorphous computing architecture (PCA) and cognitive computing.

BACKGROUND

The challenge of modern computing is to build economically efficient chips that incorporate more transistors to meet the goal of achieving Moore's law of doubling performance every two years. The limits of semiconductor technology are affecting this ability to grow in the next few years, as transistors become smaller and chips become bigger and hotter. The semiconductor industry has developed the system on a chip (SoC) as a way to continue high performance chip evolution.

So far, there have been four main ways to construct a high performance semiconductor. First, chips have multiple cores. Second, chips optimize software scheduling. Third, chips utilize efficient memory management. Fourth, chips employ polymorphic computing. To some degree, all of these models evolve from the Von Neumann computer architecture developed after WWII in which a microprocessor's logic component fetches instructions from memory.

The simplest model for increasing chip performance employs multiple processing cores. By multiplying the number of cores by eighty, Intel has created a prototype teraflop chip design. In essence, this architecture uses a parallel computing approach similar to supercomputing parallel computing models. Like some supercomputing applications, this approach is limited to optimizing arithmetic-intensive applications such as modeling.

The Tera-op, Reliable, Intelligently Adaptive Processing System (TRIPS), developed at the University of Texas with funding from DARPA, focuses on software scheduling optimization to produce high performance computing. This model's "push" system uses data availability to fetch instructions, thereby putting additional pressure on the compiler to organize the parallelism in the high speed operating system. There are three levels of concurrency in the TRIPS architecture, including instruction-level parallelism (ILP), thread-level parallelism (TLP) and data-level parallelism (DLP). The TRIPS processor will process numerous instructions simultaneously and map them onto a grid for execution in specific nodes. The grid of execution nodes is reconfigurable to optimize specific applications. Unlike the multi-core model, TRIPS is a uniprocessor model, yet it includes numerous components for parallelization.

The third model is represented by the Cell microprocessor architecture developed jointly by the Sony, Toshiba and IBM (STI) consortium. The Cell architecture uses a novel memory "coherence" architecture in which latency is overcome with a bandwidth priority and in which power usage is balanced with peak computational usage. This model integrates a microprocessor design with coprocessor elements; these eight elements are called "synergistic processor elements" (SPEs). The Cell uses an interconnection bus with four unidirectional data flow rings to connect each of four processors with their SPEs, thereby meeting a teraflop performance objective. Each SPE is capable of producing 32 GFLOPS of power in the 65 nm version, which was introduced in 2007.

The MOrphable Networked Micro-ARCHitecture (MONARCH) uses six reduced instruction set computing (RISC) microprocessors, twelve arithmetic clusters and thirty-one memory clusters to achieve a 64 GFLOPS performance with 60 gigabytes per second of memory. Designed by Raytheon and USC/ISI from DARPA funding, the MONARCH differs distinctly from other high performance SoCs in that it uses evolvable hardware (EHW) components such as field programmable compute array (FPCA) and smart memory architectures to produce an efficient polymorphic computing platform.

MONARCH combines key elements in the high performance processing system (HPPS) with Data Intensive Architecture (DIVA) Processor in Memory (PIM) technologies to create a unified, flexible, very large scale integrated (VLSI) system. The advantage of this model is that reprogrammability of hardware from one application-specific integrated circuit (ASIC) position to another produces faster response to uncertain changes in the environment. The chip is optimized to be flexible to changing conditions and to maximize power efficiency (3-6 GFLOPS per watt). Specific applications of MONARCH involve embedded computing, such as sensor networks.

These four main high performance SoC models have specific applications for which they are suited. For instance, the multi-core model is optimized for arithmetic applications, while MONARCH is optimized for sensor data analysis. However, all four also have limits.

The multi-core architecture has a problem of synchronization of the parallel micro-processors that conform to a single clocking model. This problem limits their responsiveness to specific types of applications, particularly those that require rapid environmental change. Further, the multi-core architecture requires "thread-aware" software to exploit its parallelism, which is cumbersome and produces quality of service (QoS) problems and inefficiencies.

By emphasizing its compiler, the TRIPS architecture has the problem of optimizing the coordination of scheduling. This bottleneck prevents peak performance over a prolonged period.

The Cell architecture requires constant optimization of its memory management system, which leads to QoS problems.

Finally, MONARCH depends on static intellectual property (IP) cores that are limited to combinations of specified pre-determined ASICs to program its evolvable hardware components. This restriction limits the extent of its flexibility, which was precisely its chief design advantage.

In addition to SoC models, there is a network on a chip (NoC) model, introduced by Arteris in 2007. Targeted to the communications industry, the 45 nm NoC is a form of SoC that uses IP cores in FPGAs for reprogrammable functions and that features low power consumption for embedded computing applications. The chip is optimized for on-chip communications processing. Though targeted at the communications industry, particularly wireless communications, the chip has limits of flexibility that it was designed to overcome, primarily in its deterministic IP core application software.

Various implementations of FPGAs represent reconfigurable computing. The most prominent examples are the Xilinx Virtex-II Pro and Virtex-4 devices that combine one or more microprocessor cores in an FPGA logic fabric. Similarly, the Atmel FPSLIC processor combines an AVR processor with programmable logic architecture. The Atmel microcontroller has the FPGA fabric on the same die to produce a fine-grained reconfigurable device. These hybrid FPGAs and embedded microprocessors represent a generation of system on a programmable chip (SOPC). While these hybrids are architecturally interesting, they possess the limits of each type of design paradigm, with restricted microprocessor performance and restricted deterministic IP core application software. Though they have higher performance than a typical single core microprocessor, they are less flexible than a pure FPGA model.

All of these chip types are two dimensional planar micro system devices. A new generation of three dimensional integrated circuits and components is emerging that is noteworthy as well. The idea to stack two dimensional chips by sandwiching two or more ICs using a fabrication process required a solution to the problem of creating vertical connections between the layers. IBM solved this problem by developing "through silicon vias" (TSVs) which are vertical connections "etched through the silicon wafer and filled with metal." This approach of using TSVs to create 3D connections allows the addition of many more pathways between 2D layers. However, this 3D chip approach of stacking existing 2D planar IC layers is generally limited to three or four layers. While TSVs substantially limit the distance that information traverses, this stacking approach merely evolves the 2D approach to create a static 3D model.

In U.S. Pat. No. 5,111,278, Echelberger describes a 3D multi-chip module system in which layers in an integrated circuit are stacked by using aligned TSVs. This early 3D circuit model represents a simple stacking approach. U.S. Pat. No. 5,426,072 provides a method to manufacture a 3D IC from stacked silicon on insulation (SOI) wafers. U.S. Pat. No. 5,657,537 presents a method of stacking two dimensional circuit modules and U.S. Pat. No. 6,355,501 describes a 3D IC stacking assembly technique.

Recently, 3D stacking models have been developed on chip in which several layers are constructed on a single complementary metal oxide semiconductor (CMOS) die. Some models have combined eight or nine contiguous layers in a single CMOS chip, though this model lacks integrated vertical planes. MIT's Microsystems group has created 3D ICs that contain multiple layers and TSVs on a single chip.

3D FPGAs have been created at the University of Minnesota by stacking layers of single planar FPGAs. However, these chips have only adjacent layer connectivity.

3D memory has been developed by Samsung and by BeSang. The Samsung approach stacks eight 2-Gb wafer level processed stack packages (WSPs) using TSVs in order to minimize interconnects between layers and increase information access efficiency. The Samsung TSV method uses tiny lasers to create etching that is later filled in with copper. BeSang combines 3D package level stacking of memory with a logic layer of a chip device using metal bonding.

See also U.S. Pat. No. 5,915,167 for a description of a 3D DRAM stacking technique, U.S. Pat. No. 6,717,222 for a description of a 3D memory IC, U.S. Pat. No. 7,160,761 for a description of a vertically stacked field programmable non-volatile memory and U.S. Pat. No. 6,501,111 for a description of a 3D programmable memory device.

Finally, in the supercomputing sphere, the Cray T3D developed a three dimensional supercomputer consisting of 2048 DEC Alpha chips in a torus networking configuration.

In general, all of the 3D chip models merely combine two or more 2D layers. They all represent a simple bonding of current technologies. While planar design chips are easier to make, they are not generally high performance.

Prior systems demonstrate performance limits, programmability limits, multi-functionality limits and logic and memory bottlenecks. There are typically trade-offs of performance and power.

The present invention views the system on a chip as an ecosystem consisting of significant intelligent components. The prior art for intelligence in computing consists of two main paradigms. On the one hand, the view of evolvable hardware (EHW) uses FPGAs as examples. On the other hand, software elements consist of intelligent software agents that exhibit collective behaviors. Both of these hardware and software aspects take inspiration from biological domains.

First, the intelligent SoC borrows from biological concepts of post-initialized reprogrammability that resembles a protein network that responds to its changing environmental conditions. The interoperation of protein networks in cells is a key behavioral paradigm for the iSoC. The slowly evolving DNA root structure produces the protein network elements, yet the dynamics of the protein network are interactive with both itself and its environment.

Second, the elements of the iSoC resemble the subsystems of a human body. The circulatory system represents the routers, the endocrine system is the memory, the skeletal system is comparable to the interconnects, the nervous system is the autonomic process, the immune system provides defense and security as it does in a body, the eyes and ears are the sensor network and the muscular system is the bandwidth. In this analogy, the brain is the central controller.

For the most part, SoCs require three dimensionality in order to achieve high performance objectives. In addition, SoCs require multiple cores that are reprogrammable so as to maintain flexibility for multiple applications. Such reprogrammability allows the chip to be implemented cost effectively. Reprogrammability, moreover, allows the chip to be updatable and future proof. In some versions, SoCs need to be power efficient for use in embedded mobile devices. Because they will be prominent in embedded devices, they also need to be fault tolerant. By combining the best aspects of deterministic microprocessor elements with indeterministic EHW elements, an intelligent SoC efficiently delivers superior performance.

While the design criteria are necessary, economic efficiency is also required. Computational economics reveals a comparative cost analysis that includes efficiency maximization of (a) power, (b) interconnect metrics, (c) transistor per memory metrics and (d) transistor per logic metrics.

PROBLEMS THAT THE SYSTEM SOLVES

Optimization problems that the system solves can be divided into two classes: bi-objective optimization problems (BOOPs) and multi-objective optimization problems (MOOPs).

BOOPs consist of trade-offs in semiconductor factors such as (a) energy consumption versus performance, (b) number of transistors versus heat dissipation, (c) interconnect area versus performance and (d) high performance versus low cost.

Regarding MOOPs, the multiple factors include: (a) thermal performance (energy/heat dissipation), (b) energy optimization (low power use), (c) timing performance (various metrics), (d) reconfiguration time (for FPGAs and CPLDs), (e) interconnect length optimization (for energy delay), (f) use of space, (g) bandwidth optimization and (h) cost (manufacture and usability) efficiency. The combination of solutions to trade-offs of multiple problems determines the design of specific semiconductors. The present system presents a set of solutions to these complex optimization problems.

One of the chief problems is to identify ways to limit latency. Latency represents a bottleneck in an integrated circuit when the wait to complete a task slows down the efficiency of the system. Examples of causes of latency include interconnect routing architectures, memory configuration and interface design. Limiting latency problems requires the development of methods for scheduling, anticipation, parallelization, pipeline efficiency and locality-priority processing.

SUMMARY

The present intelligent SoC represents a next generation 3D integrated circuit. The invention is an integrated dynamic intelligent system in hardware. The 3D iSoC combines several novel architectural and operational aspects in a flexible ULSI device. One design goal is to create a polymorphic computing device for multiple application domains. Because it is reconfigurable, the iSoC is able to solve MOOPs in real time by transforming its structure. The 3D iSoC also integrates features of 10 nm to 45 nm semiconductor fabrication processes so as to follow the path of Moore's law for a generation.

The present invention incorporates fully integrated 3D components into an integrated modular SoC. This modularity provides an upgrade path and allows development of a family of chips that are future proof.

The 3D SoC consists of a package of 35 reconfigurable integrated circuit nodes in a cubic configuration. This network fabric configuration presents a highly efficient and adaptable computing platform to solve numerous application problems. The IC nodes are organized in eight flexible neighborhood clusters corresponding to the corners of a cube, with a central node.

Each IC node consists of multiple reconfigurable hardware layers. The evolvable hardware components reconfigure to specific ASIC positions in order to rapidly perform a function to solve application problems. Because the 3D SoC has multiple interoperating nodes, the system is able to solve multiple problems simultaneously. Nevertheless, the SoC is tuned to specific application biases. For example, in order to preserve power, the SoC rebalances the aggregate computational load, or turns off whole sections and thus increases energy efficiency.

The system uses multiple memory modules to optimize performance. The memory modules are structured into hierarchies in order to constantly recalibrate the computational load. This asynchronous memory architecture is particularly useful for memory intensive applications.

The system is useful for multiple applications. Each application bias is focused on solving a different set of optimization problems that correspond to specific computational strengths. For arithmetic intensive applications, the chip focuses on using multiple-accumulate-convert (MAC) circuits that use look up tables (LUTs) to rapidly calculate arithmetic sums. For logic intensive applications, the chip focuses on using specialized logic circuits to solve specific classes of optimization problems. For signal processing applications, the chip focuses on using digital signal processing (DSP) calculations using fast Fourier transforms (FFTs) and other algorithms, particularly in mixed digital-analog environments. For memory intensive applications, the chip focuses on calculations and algorithms for data management. Each of these computing challenges requires refining the circuitry to solve a different class of problem.

The 3D SoC is designed to solve multiple problems simultaneously. By using its eight neighborhood clusters, it easily dedicates a set of application problems to each neighborhood cluster. A set of one to three neighborhoods is dedicated to DSP calculations, while another set of neighborhood clusters is dedicated to arithmetic intensive calculations and another set of nodes to logic intensive calculations.

The SoC's reconfigurable hardware nodes restructure the multiple layers of circuitry on demand to specific ASIC positions in order to rapidly solve various application problems simultaneously.

The invention integrates dynamic EDA modeling for custom reprogrammability. The individual circuit layers of each multi-layer node use EDA tools to configure optimal Boolean algebra solutions to specific application problems in order to efficiently structure each layer to application requirements. The Boolean algebra solutions restructure the netlists of specific circuits in tiles on each layer. These netlists are organized in IP cores and then applied to EHW nodes.

In order to identify the most efficient of the Boolean algebra solutions to apply, the system uses metaheuristics. Metaheuristics are computational learning techniques used to solve optimization problems. As application requirements change, the optimization problems evolve as well. Hybrid metaheuristics models are applied to find sets of solutions to evolving optimization problems. Examples of metaheuristics in the context of evolvable hardware (EHW) are swarm intelligence, artificial immune systems, local search and genetic algorithms. These processes provide procedures for continuous configurability of the SoC nodes in an evolutionary model of plasticity involving reconfigurable hardware.

Since each application category has different constraints, the evolutionary MOOPs of each application are solved by different neighborhood nodes in the 3D SoC. The tasks are divided between the neighborhood clusters as the SoC continuously models and then reconfigures its structure based on the modeling solution option selection. The SoC shifts from one optimization constraint to another as the goals of the chip shift and the EHW reconfigures. In particular, the effective operation of the SoC for multiple simultaneous applications depends on the specific combinations of circuit arrangements. The different families of arrangements of the different neighborhood nodes are directed to specific application biases.

Each node and neighborhood cluster in the 3D SoC is optimized for a specific application. These evolvable hardware nodes are optimized for logic intensive operation, arithmetic intensive operation, memory intensive operation and signal processing intensive operation. In addition, the data flow within the network fabric is organized by the system, with emphasis on load balancing between parallel processors so as to maximize overall system efficiency.

The Boolean logic configurations that are manifest in netlist organizations at the circuit level are the result of developing solutions to eMOOPs. These configurations are functionally applied to reconfigurable hardware circuitry with the use of IP cores and intelligent mobile software agents (IMSAs). Families of IP cores correspond to classes of optimization problems associated with each application category. D-EDA tools are used to develop specific solutions to application problems and provide netlist configurations for IP cores. The IP cores activate specific EHW circuits to change their structure to different ASIC arrangements at specific thresholds.

Since the 3D SoC is used in uncertain environments, it uses evolutionary mechanisms described herein to change its hardware configurations. Whereas for deterministic solutions, the FPGA multi-layer nodes oscillate between pre-specified ASIC positions, in indeterministic situations, hybrid meta-heuristic models are applied to solve complex eMOOPs in real time. The system creates modeling simulations of the indeterministic environment by developing alternative scenarios based on stochastic probabilities. These anticipations of experience develop into scenario trajectories, which are then used to model reconfigurable transformations of the FPGA layer positions. With this approach, the chip will experiment with providing and testing solutions to complex optimization problems. IP cores are evolved and applied to solve specific application problems.

Novelties

There are a number of novelties of the present invention. The system uses an integrated cubic configuration with 3D integrated circuit (logic, memory and hybrid) node construction. Independent nodes in a SoC are flexibly structured into octahedrons that present transforming configurations for coordinated behaviors in different applications. As demand increases and modulates, additional octahedron neighborhood node clusters are brought on-line to increase and modulate capacity.

The invention describes modeling of the architecture and dynamics of the SoC. In particular, a component of the SoC models its own reprogrammability for maximum flexibility in uncertain environments.

ADVANTAGES OF THE PRESENT SYSTEM

The present system provides numerous advantages over prior systems. The three dimensional geometrical architecture advantageously provide direct spatial connection with different parts of the chip. Because of their spatial efficiencies, 3D chips can have a far smaller footprint than comparably performing 2D chips. Given this configuration, 65 nm circuits in a node can be replaced with 16 nm to 32 nm components with far larger capacity. The symmetrical advantages of spatial efficiency lead to temporal efficiencies as well because shorter interconnects mean it takes less time to process a task, which leads to higher performance. Because of these efficiencies, 3D chips reduce power consumption.

Since the 3D IC nodes are layered, there is different functionality of the layers as well as near-simultaneous operation between the layers. Independent operation of 3D node layers indicates that each layer may function as its own core, thereby far surpassing the parallelization of traditional 2D IC architectures.

Multiple elements in the chip are reconfigurable. The combination of multiple evolvable parts creates a unique EHW capability that rapidly adapts to its uncertain environment. Because it has multiple autonomous reconfigurable components, part of the chip can model its own operation for increased polymorphous functionality.

Since it is reprogrammable, the iSoC efficiently evolves with new functions and features. This limits its obsolescence. It is customizable for specific customers and multiple applications. The iSoC consists of a family of chip configurations that allow it to be used in embedded systems, DSP systems and high performance systems.

DESCRIPTION OF THE INVENTION

While specific 3D IC elements are described elsewhere, the configuration of multiple 3D IC nodes into a 3D SoC is disclosed here. The construction of a 3D SoC is comprised of numerous components, which are configured as interconnected nodes in a complex network. The 3D SoC fabric represents a complex ULSI architecture consisting of a network of multiple differentiated 3D IC components.

The iSoC is a polylithic 3D network on a chip (NoC) which consists of multiple 3D IC nodes in a cubic configuration. The nodes are organized in the corners of the box package, along the edges, on the inside corners and at the central core. The nodes are clustered symmetrically in eight octahedrons corresponding to the corners of the cube. The nodes in each cluster, or neighborhood, are connected to each other, and each neighborhood is connected to others adjacent to it and to the master node in the central position. 3D routers and memory modules are configured in the symmetrical network to connect the IC nodes.

The 3D IC nodes consist of ASICs, FPGAs (or CPLDs) and MPs in various embodiments. Inclusion of nodes into specific neighborhood clusters in the octahedrons varies with different applications because composition in an octagon is asymmetric; that is, inclusion into an active set of nodes in one of the octahedrons will vary depending on the demands of applications. As application demands change, the configuration of one of an octahedron's set of nodes will adapt.

Whereas the configuration of the individual 3D IC nodes resembles a skyscraper building, the 3D SoC architecture resembles a city consisting of a number of connected skyscrapers.

Because it combines multiple efficient ICs, the present 3D SoC has performance characteristics that resemble a supercomputer, yet may be embedded in mobile devices.

(1) Independent Interconnected 3D Multi-Core Arrays in 3D SoC

Though single planar multi-core arrays, such as the Cell or Monarch architectures, already exist, 3D multi-core arrays within a 3D SoC represent a completely novel proposition. The present invention creates an asynchronous multi-node architecture to connect multiple 3D ICs within a 3D SoC. Each node within an octahedron is connected, with linkages between neighbor nodes. These independent multi-node arrays are interconnected to create a complex network of 3D IC nodes.

There are 35 total IC nodes in the SoC. One supercore lies in the center of the chip, while the remaining 34 nodes are divided among eight neighborhoods. At different times, each neighborhood octahedron consists of 4 to 8 nodes. Each node is capable of 64-bit data and logic processing, yet has varying capacities of memory access and throughput. The nodes consist of ASICs, FPGAs (CPLDs), MPs or hybrids, though generally they are FPGAs because of their increased performance and flexibility. The combination of various chip types creates a hybrid SoC configuration that is optimized for specific applications.

(2) Supercore as Center Core Module for Sub-System Control in 3D SoC

The center of the SoC is the supercore 3D IC. This IC is larger than the other nodes and has functionality of controlling and regulating the other multi-node neighborhood arrays. The center node controls the chip much like a brain and may be an MP, an FPGA or a hybrid reconfigurable IC. The center node also has more embedded memory than other individual nodes.

The center core module regularly interacts with all eight neighborhoods simultaneously. When configured as a 3D FPGA, different layers of the center core interact directly with different neighborhoods of the chip. When configured as a 3D multiprocessor, specific layers interact directly with different neighborhoods of the chip. The multilayer 3D IC configuration allows simultaneous independent interaction of the central node with each neighborhood.

(3) Polylithic Integration of Multiple Integrated IC Nodes in 3D SoC

Polylithic integration involves use of multiple chip types in a single SoC. The present system uses polylithic integration by assimilating two or more chip types into the hybrid IC nodes of the 3D iSoC. The most prominent chip type in the iSoC is the 3D FPGA. However, there are also 3D multiprocessors in different positions and configurations. In one embodiment, microprocessors are in the corners and at the core, and 26 FPGAs are situated in a symmetrical configuration. In another embodiment, there are FPGAs in the corners and 27 microprocessors in the other symmetrical positions. In still another embodiment, ASICs are coordinated at specific nodes, primarily to promote a specific functionality. The prominent use of FPGAs promotes a key characteristic of the iSoC, namely, its reconfigurability.

(4) Asymmetric Node Configuration in 8 Octahedrons of 3D SoC

The eight octahedrons of the 3D iSoC correspond to the corners of a cube. The 3D IC nodes are lined along the edges of the cubic iSoC configuration and in the interior of the iSoC. There is a node in each corner of the cube and in the interior of each neighborhood. Further, there are nodes between each corner node.

Though the nodes are fixed, the composition of each neighborhood is variable. Each neighborhood consists of 2 to 8 nodes at any time and changes its configuration depending on the demands of each application at a given time.

Each node works with other nodes in its neighborhood, while each neighborhood is autonomous. Neighborhoods work together and even share resources to complete a task. To optimize power distribution, whole neighborhoods can go offline while others are operational, much like a V8 engine that only uses a few cylinders when power in the whole engine is not needed.

(5) Multi-Dimensional Symmetry of IC Apparatuses in 3D SoC

The 3D configuration of the SoC has symmetry of its parts. When viewed from any side, the relationship between parts is similar. Use of the x, y and z planes in a symmetric configuration allow the SoC to have balance and efficiency. This configuration maximizes the efficiency of the interconnects between nodes, which increases performance and minimizes power usage.

In an additional embodiment of the present system, the cubic configuration of the 3D iSoC is organized into an oblong configuration. The oblong configuration is organized in two ways. First, all nodes are oblong with a two to one, or a three to one, aspect ratio. In this case, each node has fewer layers relative to a cubic configuration; the advantage of a smaller package means less performance as well. Second, the two halves of the cube are organized to be adjacent to each other so that performance is maximized when the chip package is suitable for specific embedded applications.

(6) Multi-Nodal Fault Tolerance in 3D SoC

The 3D symmetrical configuration of a 3D SoC provides for some duplication of functions. This architecture has some advantages. For example, specific octahedrons in the 3D SoC go off-line, for repair or reconfiguration, while other sections are fully operational. Because they employ FPGAs that exhibit periodic reconfiguration, the SoC depends on other sections of the chip for continuous operational utility.

These qualities are critical in order to optimize operational effectiveness as well as fault tolerance. If a part of the chip is out of service, other parts of the chip complete its mission effectively. Even if the center IC node is damaged, the chip is able to perform its tasks.

Performance Specifications

Number of Transistors for 3D SoC in Different Configurations

|  | Virtual Layers Stacked | | | Stacked Layers | |
| --- | --- | --- | --- | --- | --- |
| Tiles | 16 × 16 = 256 | 22 × 22 = 484 | 25 × 25 = 625 | 39 × 39 = 1521 | 70 × 70 = 4900 |
| Virtual Layers | 256 × 256 = 65,536 | 484 × 484 = 234,256 | 625 × 625 = 390,625 | — | — |
| Real Layer at Node (Total Layers) | 9 Virtual CMOS Layers × 12 Layers = 108 | 9 Virtual CMOS Layers × 12 Layers = 108 | 9 Virtual CMOS Layers × 12 Layers = 108 | 1521 × 1521 = 2.31 M | 4900 × 4900 = 24 M |
| Total Transistors at Node | 65,536 × 108 = 7.078 M | 234,256 × 108 = 25.3 M | 390,625 × 108 = 42.2 M | 2.31 M × 12 = 27.76 M | 24 M × 12 = 288 M |
| Total Transistors/ 35 nodes | 248 M | 855 M | 1.476 B | 971.65 M | 10.08 B |
| Total Transistors/ 38 nodes* | 269 M | 961.4 M | 1.6 B | 1.055 B | 10.94 B |
| Fab generation | 45 nm | 32 nm | 32 nm | 22 nm | 16 nm |

*In one embodiment, the center node is equivalent to four nodes in total computability.

Performance Per Transistor

|  | MP | Advanced MP | FPGA | ASIC |
|---|---|---|---|---|
| Number of Transistors | 1 B | 10 B | 1 B | 1 B |
| GFlops/1B transistors | 30 | 300 | 2400 | 2400 |
| Transistors per GFlops | 33.3 M | 33.3 M | .416 M | .416 M |
| Performance ratio | 1 | 1 | 80 | 80 |
| Total performance/ 1B transistors | 30 GFlops | 30 GFlops | 2400 GFlops | 2400 GFlops |

Operational Performance

|  | Economy Version | Standard Version | High Performance Version |
|---|---|---|---|
| Performance per Layer | 1.5 GFlops | 3 GFlops | 6 GFlops |
| Performance per Node (12 layers as standard configuration.) | 18 GFlops | 36 GFlops | 72 GFlops |
| Overall Operational Performance | 675 GFlops | 1.35 TFlops | 2.7 TFlops |
| Energy usage | 50-80 Watts | 50-80 Watts | 50-80 Watts |
| Wattage per GFlop | 3.375-5.4 GFlops/watt | 6.75-10.8 GFlops/watt | 13.5-21.6 GFlops/watt |

(7) Methods of Combining 3D IC Nodes in 3D SoC Package

Systems on chips (SoCs) are complex integrated circuits (ICs) that contain numerous circuitry elements, particularly multiple connected IC cores. Combining multiple 3D IC nodes in a 3D SoC package is essential to providing network fabric connections and functionality. In particular, the 3D SoC of the present invention has as a main embodiment the cubic configuration in order to maximize network efficiencies.

In cubic architecture, multiple nodes of the SoC are connected much as one builds a house. After a foundation (packaging material that also contains some functionality such as memory in slots in the sleeves) is installed, 3D IC nodes are installed in the preferred positions, and the interconnects (plumbing) are installed to connect the nodes. Switches and memory modules are also added and connected to the cubic package as layers are combined to create the completed 3D SoC.

Different fabrication processes are used for different chip elements in the 3D SoC. In some instances, the memory modules and 3D ICs are comprised from deep submicron lithographic methods ranging from 10 nm to 32 nm. The scale of the wafer manufacturing processes used to fabricate the IC nodes is smaller than that used to assemble the overall SoC package. This process creates an intermediary fabrication process that is highly automated. The advantage of this model of constructing a 3D SoC from separate nodes is that each node can use different scale foundry processes, yet the multiple ICs are combined into a modular, highly efficient and adaptive package.

3D Intelligent SoC Architecture and Dynamics Modeling

Electronic design automation (EDA) is a form of computer aided design (CAD) focused on semiconductor architecture. Productivity of chip design blossomed a hundred-fold when EDA tools were implemented less than a generation ago. EDA is typically used in modeling two dimensional semiconductor design configurations to lay out the transistor circuitry and interconnect routing pathways. The logic synthesis for EDA techniques is either top-down or bottom-up, the latter of which involves full chip synthesis.

EDA tools use hardware description languages, such as VHDL or Verilog, to describe the behavior of an electrical circuit or system. The most popular EDA program is VPR (Virtual Place and Route), which is used for 2D environments. The 2D EDA tools have limits, however.

The 2D EDA tools do not model 3D systems. The Euclidian space challenges of 3D modeling are not satisfied with planar tools. In addition, there are limits to 2D EDA tools in modeling dynamic processes. For example, the software and evolvable hardware interactions are not modeled with traditional EDA tools. To model the dynamics of the 3D intelligent SoC, 3D animation tools are needed.

3D EDA tools do exist. PR3D, 3D Magic and TPR (Three Dimensional Place and Route) are useful design tools for 3D circuitry. These tools need to be updated to accommodate complex sequential reprogrammable circuitry in the 3D SoC by employing simulation techniques to model complex evolvable hardware interactions. The present system requires a dynamic EDA (D-EDA) modeling tool suite.

D-EDA tools provide sophisticated animation to represent complex simulation scenarios. Multiple scenarios of placement and routing architectures are provided, and tested, in order to recommend the optimal strategy to achieve a goal within constraints. The system then selects and refines the optimal approach.

The present disclosure describes solutions to problems involving the use of 3D dynamic EDA tools to model complex dynamics of reconfigurable components in a 3D iSoC.

(1) 3D-CAD Modeling of SoC Structure

VPR and other 2D design tools use optimization algorithms to efficiently organize interconnect wire length and configurations on 2D semiconductor circuits. This is done by partitioning the circuit into minimal sections using placement algorithms for transistor and cell arrangements and routing algorithms for interconnect pathway pattern arrangements. VPR uses a global routing tool and a layout editor to organize the circuit layout and routing architectures.

TPR, PR3D and 3D Magic employ derivative techniques for 3D circuit placement and routing layout by synthesizing multi-planar configurations. In general, these EDA tools specify the bonds between 2D layers and treat the 3D SoC network fabric as one entity. 3D Magic automates the organization of TSVs between the two adjacent circuit layers and preserves electrical connectivity data between all layers in a 3D circuit.

In general, the 3D EDA tools, like their 2D predecessors, are static and simply list the building components of a circuit. A simple color-coded representation of placement and routing of 3D circuitry is not sufficient to model the dynamics of a 3D iSoC, however. The complex dynamic functionality of an iSoC ecosystem that includes multiple reprogrammable components cannot be modeled using static CAD tools, much as a still camera is insufficient to capture movies. In particular, the software interactions between 3D evolvable hardware components involve the modeling of the dynamics of 3D reconfigurable hardware and reprogrammable software, which require dynamic 3D modeling tools. The dynamic processes of multiple interacting IP cores are implemented by IMSAs and require D-EDA tools to design dynamic reorganization processes in real time.

(2) Solving Bi-Objective Optimization Problems (BOOPs) in 3D SoC Using Competitive Modeling Specific BOOP constraints are analyzed by the D-EDA tools to develop prospective solutions. The constant adjustment of reconfigurable circuit placement and routing objectives leads to creation of alternative solution options. The D-EDA design tools identify iSoC intra-node 3D interconnect and TSV structure and function optimization solutions for specific placement and routing problems.

Each SoC application involves a specific optimal configuration. However, since the 3D iSoC uses EHW components, application specificity will change. These changing applications require the EDA to modify the specifications of the optimization problems. The design of 3D reconfigurable circuits requires solving BOOPs as they change.

Solving BOOPs requires the modeling of two main competitive constraints. Generating a set of solution options to the two opposing objectives requires the organizing of a set of trade-offs. After identifying the main objectives, the D-EDA tools provide a range of solution options that signify the trade-offs between the constraints. The final solutions chosen for each BOOP are tested prior to their application.

(3) Multiphasal Customization in Reprogrammable 3D SoC Using 3D CAD RTL Modeling Register transfer level (RTL) design is used to describe a circuit's operational behavior. Hardware description languages, such as VHDL and Verilog, describe logical operations on the flow of signals using hardware registers (function coordination) and combination logic (logic gate organization) at a high level of circuit abstraction. RTL explicates an integrated circuit's signal flow between registers. Organizing 3D RTL requires a higher level of complexity than is found in traditional 2D approaches.

While the design of ASIC or static circuits is straightforward with traditional tools, the organization of 3D reconfigurable hardware requires a multiphasal method of design. The process of configuring evolvable hardware in an iSoC involves recognizing the continuous process of reconfiguration as a series of steps. In effect, if a 2D FPGA reconfiguration process is a succession of ASIC configurations, 3D FPGAs in an iSoC require the modeling of complex dynamics between multiple circuit layers and nodes.

RTL design approaches applied to the 3D iSoC synthesize the multiple independent ASIC positions in the 3D FPGA circuitry. As the FPGA reconfigures its multi-layer logic blocks to a new position, the RTL design methodology activates a new phase in its hardware rearrangement process. An FPGA is modeled within optimization constraints in an initial setting with D-EDA. The reconfigurable circuitry is then adjusted to a new application-specific position. By combining multiple phases in the process with the operation of multiple layers, the design method for a dynamic reconfigurable system is organized.

Customization of the EHW design flows occurs by modifying specific phases of the RTL process. The D-EDA design is delivered to FPGAs by using IP cores in VHDL.

(4) D-EDA for Modeling Reprogrammable 3D SoC Internodal Operations

A continuously reconfigurable 3D SoC, because of its polymorphous computing dynamics and multiple nodal reprogrammable behaviors, requires dynamic EDA (D-EDA) tools to model the network fabric of its ecosystem. 3D D-EDA builds a map of the SoC's overall structure, identifies the architectures of the nodes and the interconnection network, and models specific sub-system operations separately.

The modeling of deterministic 3D SoC operations is performed with RTL and transaction level modeling (TLM) design tools. The internodal network modeling of indeterministic 3D iSoC behaviors is performed via a search for the most efficient layout and routing for continuous reprioritization of objectives. The complex transformational activities of 3D reconfigurable components in the iSoC require the use of D-EDA tools to coordinate different functions.

(5) Training Reprogrammable 3D SoC D-EDA

D-EDA configures custom applications by using several stages of set-up. The D-EDA process is organized via the use of IMSAs in the MAS to configure, assess and adapt its layout and routing functions. Specifically, memory access processes, application-specific compiler optimization and communication network operations are organized by D-EDA processes.

D-EDA modeling optimizes the configuration of the 3D iSoC for specific functional applications. By accessing a library of similar circuit configurations for specific applications, the D-EDA system reverse engineers the optimal specification for the circuit configuration.

The system develops scenarios of possible options by constructing animations of optimization solutions. These complex animations are used to model chip functional operations and to reorganize the reconfigurable hardware components. As it gradually refines the process of satisfying specific MOOPs, the system reorganizes and reprograms the circuitry until specific configuration solutions are developed and implemented. The proposed solutions are tested and the feedback from the tests is used to continue to refine the configuration implementation. This testing process is used to "train" the iSoC for specific functional purposes. Inclusion of new programming features continues this solution, implementation and testing process. The training process is dynamic.

Specific neighborhood clusters of the iSoC are continuously reorganized by using the D-EDA modeling process. Each neighborhood cluster is autonomous, but cooperatively interacts with other neighborhood clusters.

(6) Implementation and Tuning of IP Cores for 3D FPGA with D-EDA

Though it is implemented with IMSAs in the SoC, the EDA modeling process integrates with IP cores as they are applied to 3D FPGAs. The IP core is the programming module used by FPGAs to reorganize the netlists of the reprogrammable hardware circuitry in logic blocks. D-EDA modeling is used to implement evolvable IP cores in FPGAs because the circuitry simulations are performed with D-EDA tools and solutions to MOOPs are specified in the IP core for implementation to the FPGA. Multilayer FPGA dynamics require a complex evolvable IP core to allocate multiphasal process functionality, which is provided by D-EDA processes.

The D-EDA temporal logic components allow the evolutionary IP core(s) to continuously reconfigure the 3D FPGA according to multiple scenarios. These scenarios are structured as a set of options to MOOP solutions. This flexibility provides the FPGA with great latitude to complete a task within broad design constraints, rather than the confining constraints of present system determinism.

The D-EDA modeling process uses metaheuristics to guide the evolutionary constraints of the reconfigurable circuit mechanism. Specifically, the system uses hybrid genetic algorithms for maximum efficiency and hybrid multilayer artificial immune systems for solutions to novel problems.

(7) Auto-Programming of 3D SoC Using On-Board EDA Implemented by Generating Simulation Scenarios The iSoC is initially inert. The basic inert chip plugs into a modeling program for specific functional organization. The static initial configuration is reconfigured with multiple programming aspects. The dynamic program configurations are then provided. Once the chip gets feedback from its experience in its environment, the chip is tuned and the programming dynamics are refined.

The 3D iSoC uses specific simulations of scenarios by employing 3D animation in D-EDA modeling, as implemented in evolutionary IP cores, to structure scenario options for MOOP solutions for each application. This procedure allows the reconfigurable FPGA nodes to proceed indeterministically to solve problems in indeterministic environments.

In one embodiment of the invention, a specific neighborhood cluster models the 3D iSoC operations. This on-board D-EDA capability, with the help of IMSA collective behaviors, allows the chip to continuously program, and reprogram, itself. With these processes, the iSoC designs and programs itself on the fly.

3D Intelligent SoC Applications

In its generic configuration, there are several main application categories for the 3D SoC. First, the SoC is useful for logic intensive operations, particularly for modeling and high performance applications. Second, it is useful for arithmetic intensive operations, particularly for digital signal processing (DSP). Third, it is useful for memory intensive operations, including database management, multimedia and communications applications. It is also useful for embedded operations, particularly for small footprint (i.e., energy efficient) applications that require continuous modulation of scarce resources. Finally, the chip is useful for multi-functional applications in continuous re-optimization processes between the main computing application categories.

Because it is continuously reconfigurable, the 3D SoC is particularly useful in uncertain environments in which real time interaction and mission critical functionality require rapid reprogrammability and adaptivity.

The 3D SoC is a family of chips. Not only are there different versions for specific computing application environments, but over time versions of the chip will get both smaller and more powerful as the fabrication techniques appreciably shrink the transistors in the 3D IC components.

In general the 3D SoC chip family (Prometheus) consists of three main versions: (a) high performance, (b) standard and (c) economy. The chip may contain nearly identical elements that are tuned in different ways for sale in each of the categories. The economy version is useful in embedded devices that require a smaller footprint and increased energy efficiency. The standard version is useful for arithmetic intensive DSP applications and memory intensive applications. The high performance version is useful in logic intensive scientific applications and multi-functional applications.

Each of the main versions of the 3D SoC is tuned with different specification biases. The performance specifications of the chip initially require more than one Teraflop of performance for the standard version, with marginally lower performance requirements for the economy version and relatively greater performance for the high performance version. As chip performance evolves, this generation of technology will peak at over 10 Teraflops for the high performance version, particularly once the transistor scale achieves 10 nm.

Each of the main versions of the 3D SoC is customized to specific application requirements. For example, memory-intensive applications require additional memory modules. In addition, high performance applications require intensive use of reconfigurable ICs, particularly for specific environments. The FPGAs of each of these customized applications are biased, and tuned, for specific uses.

(1) Optimizing Embedded Computing Solutions with 3D SoC

Embedded computing devices perform only a few application functions with limited programmability. Embedded devices appear in a broad range of applications. Microcontrollers use embedded computing. Embedded controllers are found in a range of systems, including automotive (car safety, power train, suspension, multimedia and telematics systems), aerospace (avionics, space and satellite systems), industrial (factory systems), robotics, durable products (washing machines), medical devices and mobile (hand held communications) systems.

Embedded computing has generally been the province of ASIC computing because of the focus on one set of deterministic applications. However, the 3D SoC increases the functionality of embedded computing solutions beyond a single narrow application. In particular, the SoC is useful as an efficient controller of multiple systems. This functional utility is particularly notable in aerospace, robotics and industrial applications which require high performance computing capabilities.

The 3D SoC performs multifunctional controller operations by using several neighborhood clusters to execute multiple independent actions simultaneously. Though embedded applications use ASICs to perform specific functions rapidly, the SoC uses EHW to transform hardware structure to multiple ASIC positions.

IP cores are applied to specific MOOPs to transform the hardware configurations of FPGAs to specific ASIC positions in order to achieve rapid execution of embedded application tasks. As the conditions in the environment change, the FPGA circuit structures change because the hardware applies metaheuristics to solve MOOPs and integrate new IP cores that continue to reconfigure hardware circuits.

Hybrid GA, and other evolutionary computation techniques, are applied to generate solutions to BOOPs in embedded computing applications using the 3D SoC given resource constraints. This model of applying EHW solutions to optimization problems in specific application environments allows a leap in productivity by maximizing efficiency of operations and minimizing down time.

(2) Digital Signal Processing with 3D SoC

Digital signal processors (DSP) are computing devices that are applied to the processing of video and communications signals. The two main application categories of DSP computing are mobile devices and home devices. In mobile devices, DSPs are used for mobile communications, mobile computing, mobile multimedia and multifunctional applications. In particular, mobile devices have low power efficiency resource constraints. In home devices, DSPs are used in set-top boxes, in game machines and in home control systems to process multimedia (voice, image and data signals), video (HDTV) and interactive digital media signals. DSP devices are also used in sensor networks, in mixed signal (digital-analog) systems and in medical imaging. DSPs use FPUs and MACs to efficiently process digital signals.

The 3D SoC implements DSP functionality by using mixed signal circuitry consisting of digital to analog converters (DACs) and analog to digital converters (ADCs) on the layers within the nodes in the system. This analog circuitry allows the SoC to maintain multimedia processing functionality with multiple applications. Because the SoC is multifunctional and evolvable, the nodes reconfigure periodically to maximize solutions to specific application problems. While DSPs have historically been ASICs, they are implemented in the 3D SoC by FPGAs.

Adopting FPGAs for DSP functionality is particularly useful in complex and uncertain environments because the multiple SoC nodes reconfigure on demand to solve DSP applications as they arise, rather than employing static ASICs with limited DSP functionality. As the system encounters DSP applications, the system reconfigures to solve the optimization problems on demand, which is a particularly efficient use of computational resources.

(3) Optimizing Arithmetic Intensive High Performance Computation in 3D SoC for Modeling Applications High performance computing requires more than fast chips. Scientific modeling (for physics, weather, proteomics [molecular dynamics], economics and finance modeling) requires heavy arithmetic computation resources. Arithmetic intensive computation requires active use of logic and memory components in order to optimize modeling solutions. High performance arithmetic intensive modeling uses multiply-accumulate-convert (MAC) components to perform modeling simulations involving representation of many variables.

Historically, modeling applications have required supercomputers that use highly parallel computing systems. However, the present 3D SoC satisfies high performance aggregate computing specifications because it uses 35 multilayer nodes in parallel in a single chip.

In addition to modeling, arithmetic intensive computing includes data mining and pattern recognition as well. In addition to high performance computing resources, these applications require novel metaheuristics techniques to solve complex problems.

Complex data intensive applications require analysis of massive data sets. The present system processes these massive data sets by employing substantial memory resources on the chip. By sharing and remodulating the memory components, the MAC components efficiently optimize the data sets used in modeling systems. The present system uses the reconfigurability capabilities of the multiple nodes in the 3D SoC to optimize modeling problems. Specifically, the SoC uses multiple neighborhood clusters to solve complex problems by reconfiguring the FPGAs to optimize their structure for arithmetic intensive operations.

(4) Autonomous Network Computing Using 3D SoCs

Enterprise applications require network centric solutions. Enterprises need network switches and multimedia capability in their network computing environments. The present 3D SoC is particularly useful in modulating autonomous networks in order to organize and reallocate bandwidth capacity. The SoC uses optical circuitry interfaces to order to perform high bandwidth functionality.

Network computing applications involve numerous automation contexts, which rely increasingly on multifunctional computational resources to solve network problems. Specifically, software components organize, orchestrate, automate, defend, regulate and repair computer networks by implementing EHW capabilities.

The present 3D SoC is well suited to the network computing environment. The SoC's multifunctional reconfigurable computing capabilities are applied to network processes.

By anticipating and modeling network flows, the 3D SoC interacts with and reorganizes network data to create adaptivity and plasticity behaviors. The use of multiple 3D SoCs in a computer network produces the most effective network computing solutions.

(5) Multifunctional Applications with 3D SoC

The 3D SoC is useful in combining multiple application functions in one computational resource. Because it has several neighborhood clusters that operate independently and because it is reconfigurable, the SoC is designed to perform multiple simultaneous application functions. The use of a single chip for several simultaneous, embedded, arithmetic intensive and DSP applications is highly efficient.

Not only are the various neighborhood clusters useful for multiple simultaneous application functionality in the SoC, but individual nodes are multifunctional and reconfigurable as well. This capability allows any node in the SoC to be used for multifunctional applications.

The chip is applicable to complex embedded applications in which multiple controllers are required in an efficient package to solve multiple simultaneous problems. Examples of complex multifunctional applications that utilize the multifunctional capabilities of the SoC include satellites, factory automation and network computing.

Each node in the 3D SoC reconfigures on demand to adapt to specific application optimization constraints. The processes are performed by EDA modeling that solves the specific circuit configuration problems on particular node layers by employing hybrid metaheuristics; the solutions are then sent to IMSAs to install custom IP cores to reconfigure FPGA netlists. Because the 3D SoC interacts with evolving environments, the solutions to eMOOPs are constantly changing. These new solutions are presented to continuously reconfigurable FPGA circuits that are mated to specific application environments. The combination of these processes presents evolvable hardware solutions to evolving environmental problems.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.) the terms (including a reference to a "means") used to describe such elements are intended to correspond, unless otherwise indicated, to any element that performs the specified function of the described element (i.e., that is functionally equivalent), even though not structurally equivalent to the disclosed structure that performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

ACRONYMS 3D, three dimensional
ASIC, application specific integrated circuit
BOOP, bi-objective optimization problem
CAD, computer aided design
CMOS, complementary metal oxide semiconductor
CPLD, complex programmable logic device
D-EDA, dynamic electronic design automation
DIVA, data intensive architecture
DLP, data level parallelism
EDA, electronic design automation
EHW, evolvable hardware
eMOOP, evolvable multi-objective optimization problem
FFT, fast Fourier transform
FLOPS, floating operations per second
FPCA, field programmable compute array
FPGA, field programmable gate array FPU, floating point unit
HPPS, high performance processing system
IC, integrated circuit
ILP, instruction level parallelism
IMSA, intelligent mobile software agent
IP, intellectual property
iSoC, intelligent system on a chip
MAS, multi agent system
MEMS, micro-electro-mechanical system
MONARCH, morphable networked micro-architecture
MOOP, multi-objective optimization problem
MPSOC, multi-processor system on a chip
NEMS, nano-electro-mechanical system
NoC, network on a chip
PCA, polymorphous computing architecture
PIM, processor in memory
RISC, reduced instruction set computing
RTL, register transfer level
SCOC, supercomputer on a chip
SoC, system on a chip
SOI, silicon on insulation
SOPC, system on a programmable chip
SPE, synergistic processor element
TLP, thread level parallelism
TPR, three dimensional place and route
TRIPS, Tera-op reliable intelligently adaptive processing system
TSV, through silicon via
ULSI, ultra large scale integration
VHDL, VHSIC hardware description language
VHSIC, very high speed integrated circuit
VLSI, very large scale integration
VPR, virtual place and route
WSPS, wafer level processed stack packages

DESCRIPTION OF THE DRAWINGS

FIG. 18 is a chart specifying the transistor type used in multiple types of semiconductors.

FIG. 19 is a chart indicating the specifications of the tiles and layers of a 3D IC.

FIG. 20 is a chart showing the main uses of three types of 3D IC applications.

FIG. 35 is a flow chart showing the process of an initial 3D iSoC programming process.

FIG. 36 is a flow chart showing the auto-programming process of a 3D iSoC.

DETAILED DESCRIPTION OF THE DRAWINGS

A three dimensional system on a chip consists of a package of multiple multilayer IC nodes configured in a network. The 3D IC nodes are organized in neighborhood sections in order to perform specific tasks. The use of multiple neighborhoods of nodes promotes parallel processing of complex computational tasks. The 3D SoC contains a central node that organizes functions of the overall device.

Figure 1:
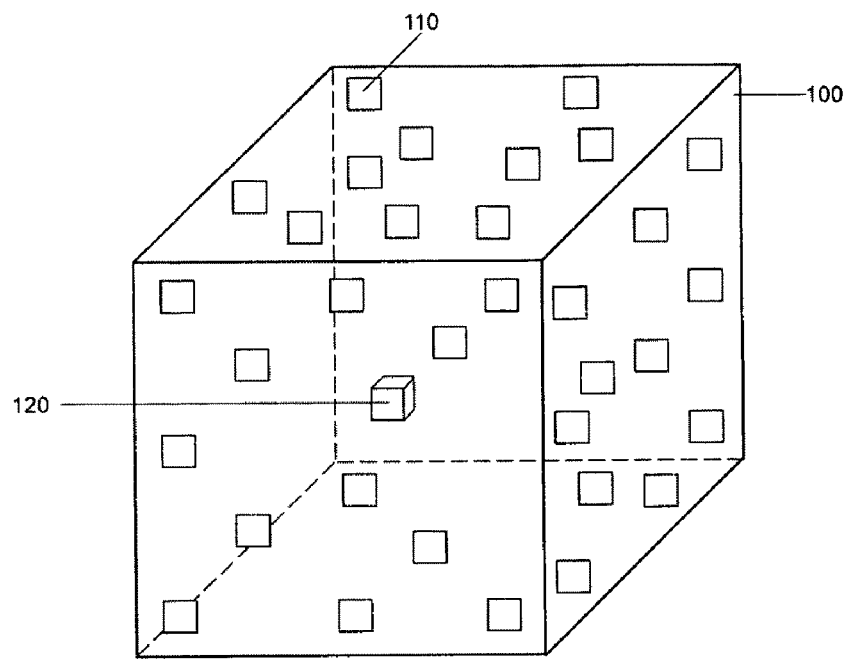
FIG. 1 is a schematic diagram of a three dimensional system on a chip (3D SoC) showing 35 internal nodes.
Figure 2:
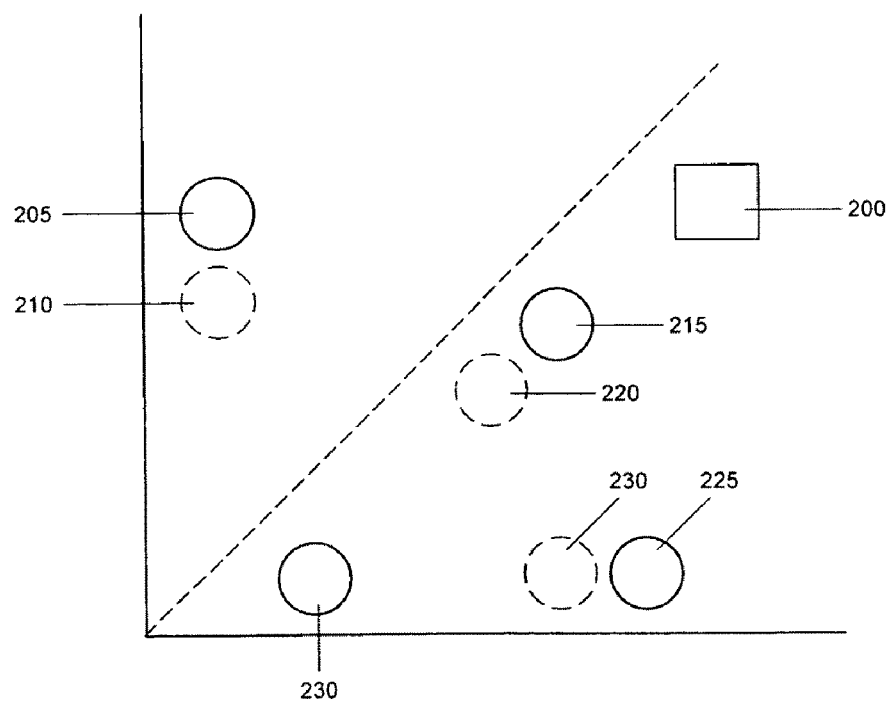
FIG. 2 is a schematic drawing of a set of nodes in a neighborhood cluster configuration in a section of a 3D SoC.

FIG. 1 shows a 3D SoC (100) in which the central node (120) is surrounded by thirty four IC nodes. FIG. 2 shows a set of nodes in a neighborhood cluster configuration in a section of a 3D SoC. The cluster has a variable configuration depending on the number of nodes included for specific applications. The cluster consists of from 2 to 8 nodes at any time. The nodes at 205, 215, 225 and 230 are main adjacent nodes in a specific configuration. The cluster also contains the nodes at 210, 220 and 230 in some configuration options. The central node is specified at 200.

Figure 3:
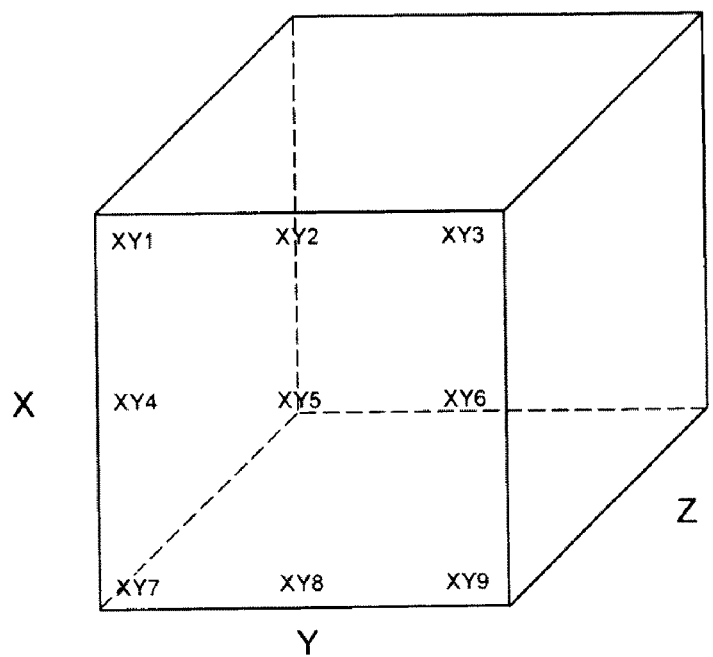
FIG. 3 is a schematic diagram showing the facade of a 3D SoC with the XY dimension IC nodes.

FIG. 3 shows one facade of a 3D SoC with XY dimension IC nodes at XY1 to XY9.

Figure 4:
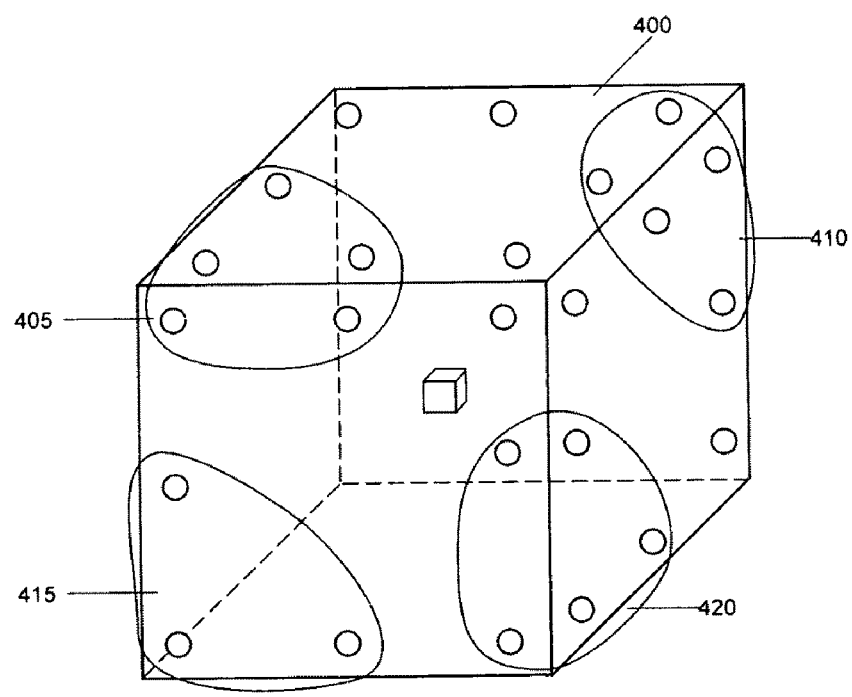
FIG. 4 is a schematic diagram showing a 3D SoC with specific neighborhood cluster configurations highlighted.
Figure 5:
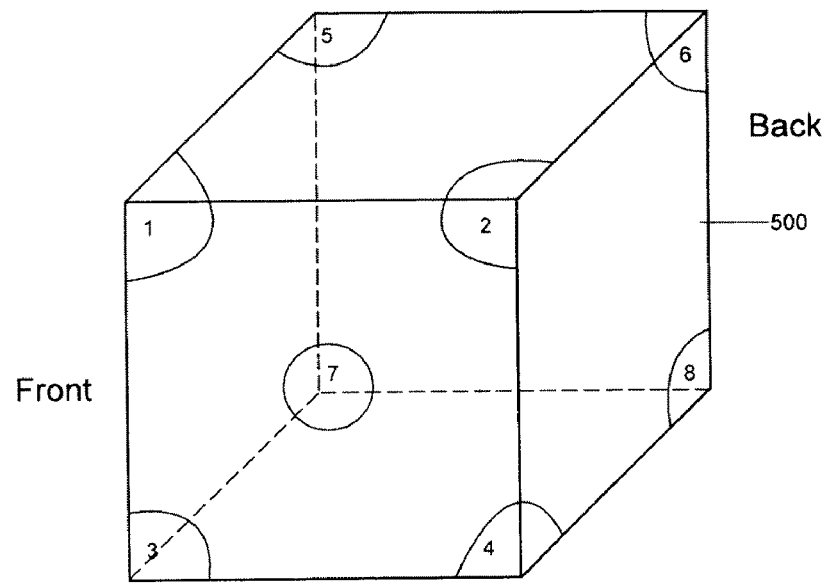
FIG. 5 is a schematic diagram illustrating the eight main neighborhood clusters of a 3D SoC.
Figure 6:
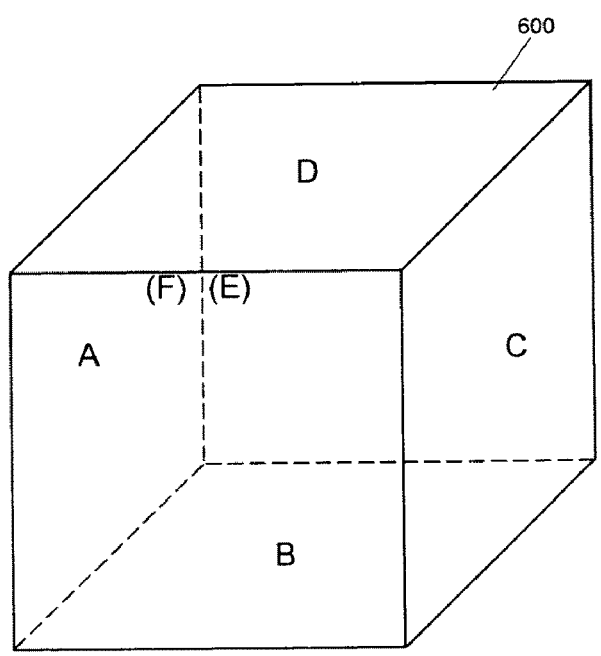
FIG. 6 is a schematic diagram showing the six side facades of a 3D SoC.
Figure 7:
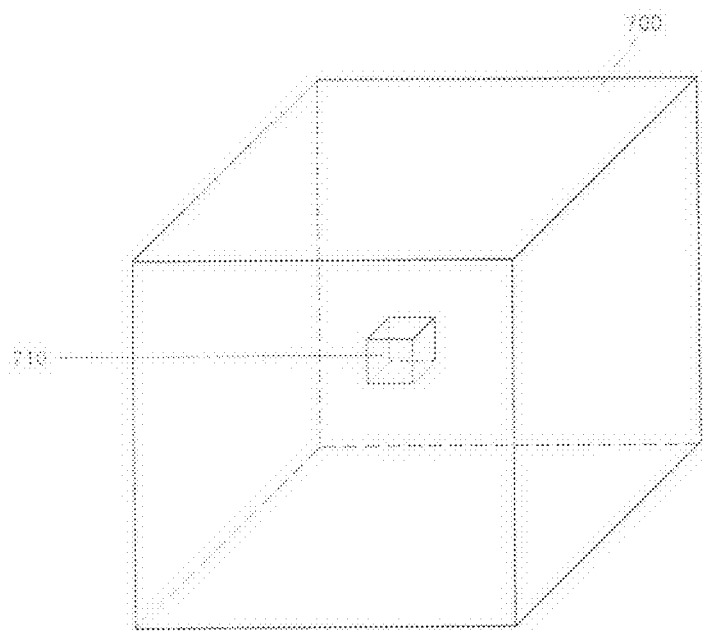
FIG. 7 is a schematic diagram illustrating the center IC node in a 3D SoC.

FIG. 4 illustrates the configuration of four neighborhood clusters. The cluster at 405 consists of five nodes, the cluster at 410 consists of five nodes, the cluster at 415 consists of three nodes and the cluster at 420 consists of five nodes. FIG. 5 shows the eight neighborhood clusters (1-8) in the corners of the cube (500). FIG. 6 shows the six facades of the 3D SoC cube. FIG. 7 shows the central multilayer IC node (710) in a 3D SoC (700).

Figure 8:
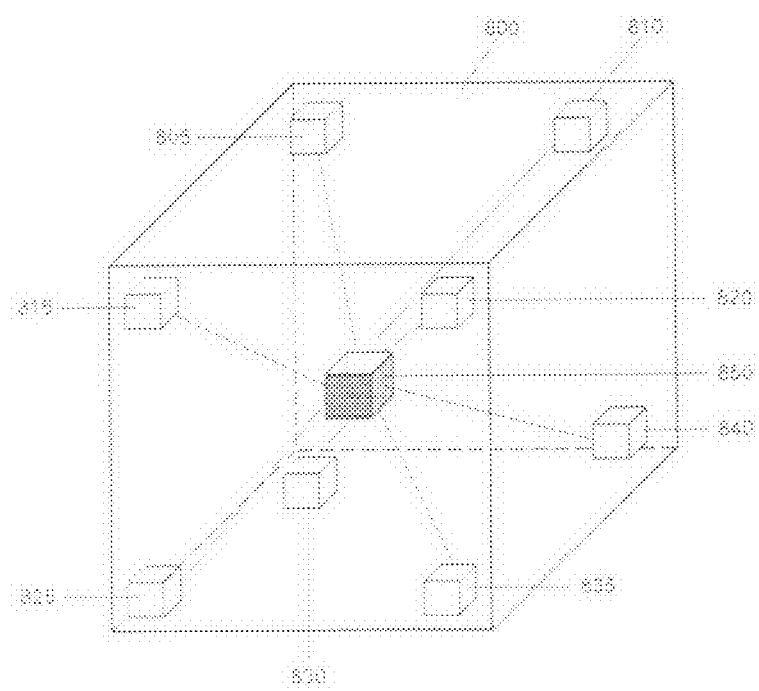
FIG. 8 is a schematic diagram showing the central multilayer IC node layers connected to nodes in eight neighborhoods clusters.

FIG. 8 shows eight three dimensional IC nodes (805, 810, 815, 820, 825, 830, 835 and 840) in specific neighborhoods connected to the central node (850) in a 3D SoC (800). Different layers of the central node are shown connected to the neighborhood nodes.

Figure 9:
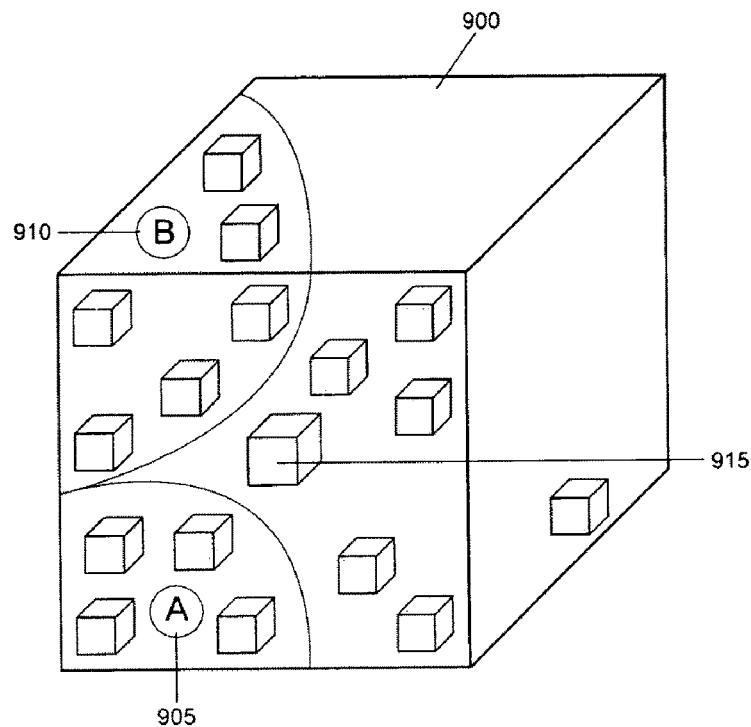
FIG. 9 is a schematic diagram showing two main groups of nodes in specific configurations.

FIG. 9 shows two main groups of nodes in specific configurations in a 3D SoC. Four nodes (905) are configured in neighborhood cluster A. Six nodes (910) are configured in neighborhood cluster B.

Figure 10:
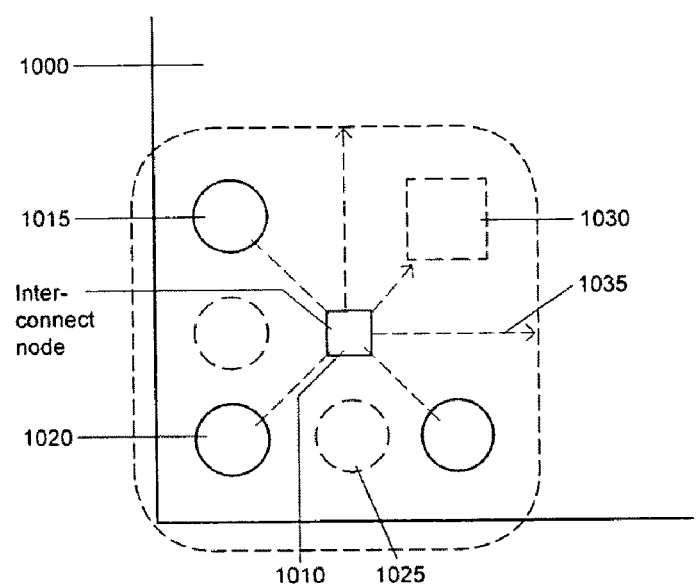
FIG. 10 is a schematic diagram showing a neighborhood cluster of nodes in a 3D SoC connected to an interconnect node.

FIG. 10 shows a neighborhood cluster of nodes in a 3D SoC connected to an interconnect node. The interconnect node (1010) connects the corner node (1020) and the adjacent nodes at 1015 and 1040. The interconnect node also connects to the inner neighborhood node (1030). This connection scheme allows the routing of data and program code between layers of nodes in the neighborhood cluster.

Figure 11:
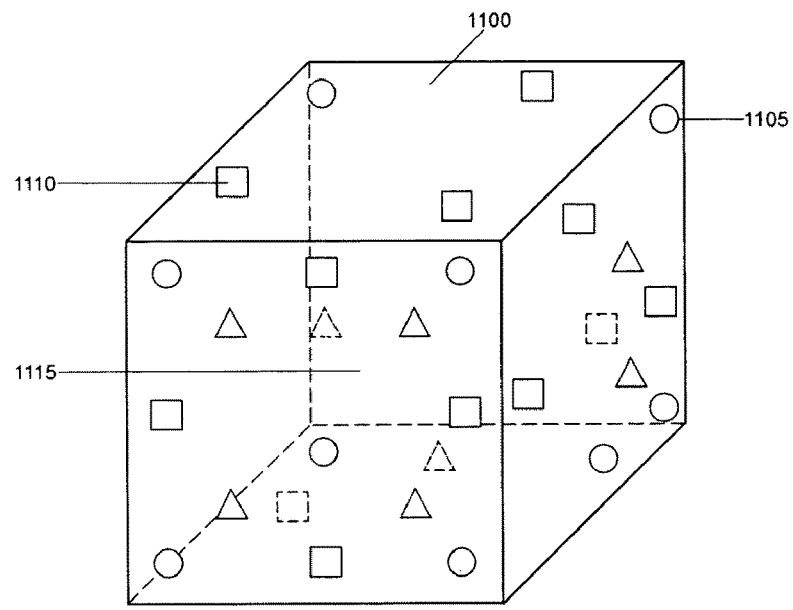
FIG. 11 is a schematic diagram showing the use of microprocessors, ASICs and FPGAs in a configuration in a 3D SoC.

FIG. 11 shows the use of microprocessors, ASICs and FPGAs in a configuration in a 3D SoC. The positioning of the different types of logic devices in different locations in the 3D SoC allows multiple types of computer tasks to be performed in parallel. In this scheme, microprocessors are located in the corners, while ASICs are located in positions at the sides of the SoC. Nevertheless, in most configurations, each node contains multiple logic components in a hybrid arrangement.

Figure 12:
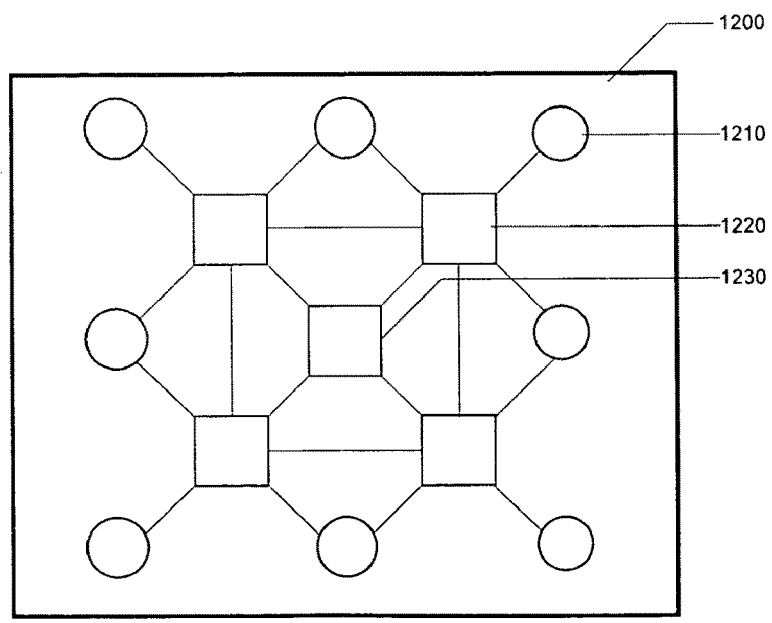
FIG. 12 is a schematic diagram illustrating the 2D view of one plane of a 3D SoC.

FIG. 12 illustrates a 2D view of one plane of a 3D SoC. The central node (1230) is surrounded by the four inner neighborhood nodes (1220), with the eight nodes (1210) at the outside edges.

Figure 13:
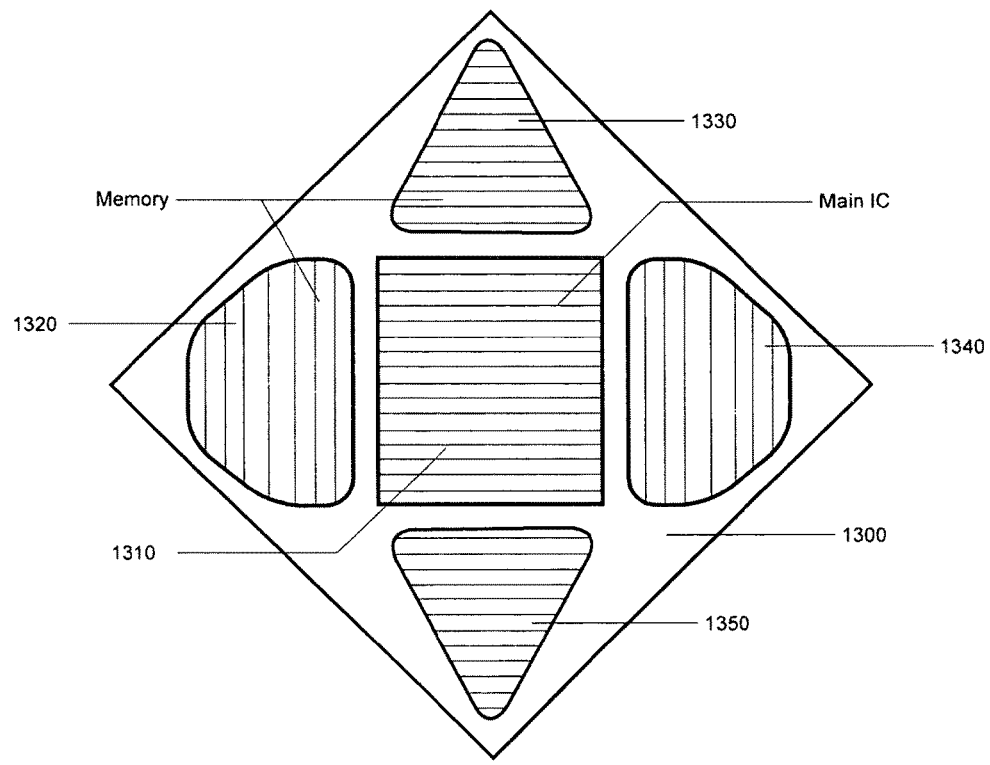
FIG. 13 is a schematic diagram showing a diamondoid configuration of a neighborhood cluster with memory satellites around a hybrid multilayer IC.

FIG. 13 shows a diamondoid configuration of a neighborhood cluster with memory satellites around a hybrid multilayer IC. The multilayer main IC (1310) is surrounded by and connected to memory components (1320, 1330, 1340 and 1350). This configuration provides substantial computing capability for a single node in a neighborhood cluster.

Figure 14:
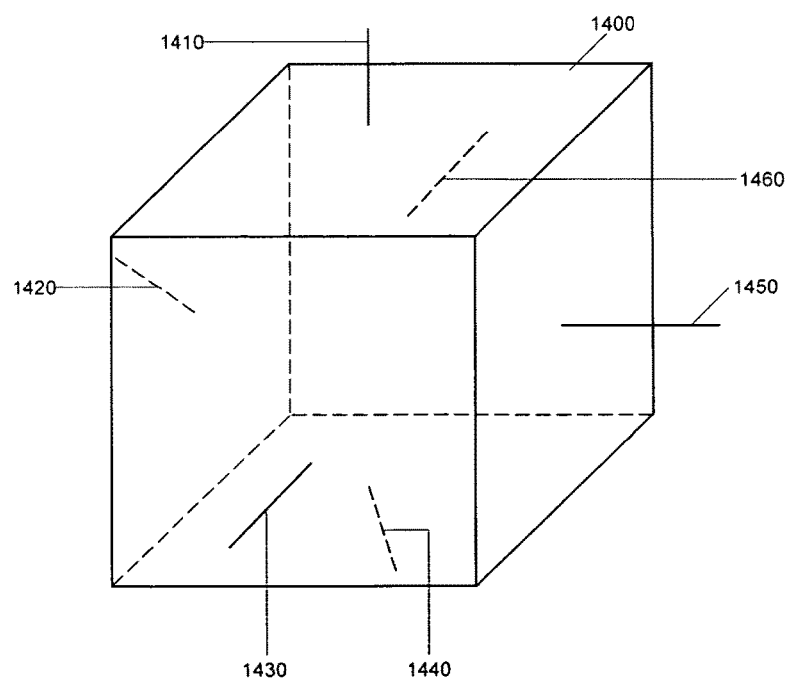
FIG. 14 is a schematic diagram showing the central core with connection outputs from six facades.

FIG. 14 shows the central core (1400) of a 3D SoC with connection outputs (1410, 1420, 1430, 1440, 1450 and 1460) from six facades.

Figure 15:
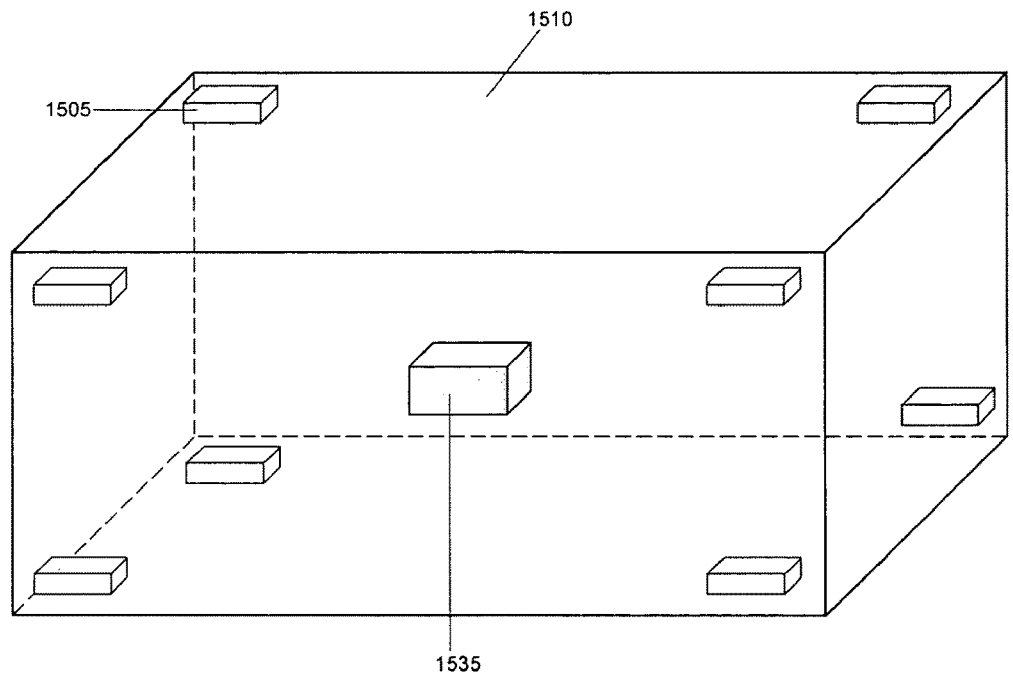
FIG. 15 is a schematic drawing of an oblong configuration of a 3D SoC with rectangular structured nodes.
Figure 16:
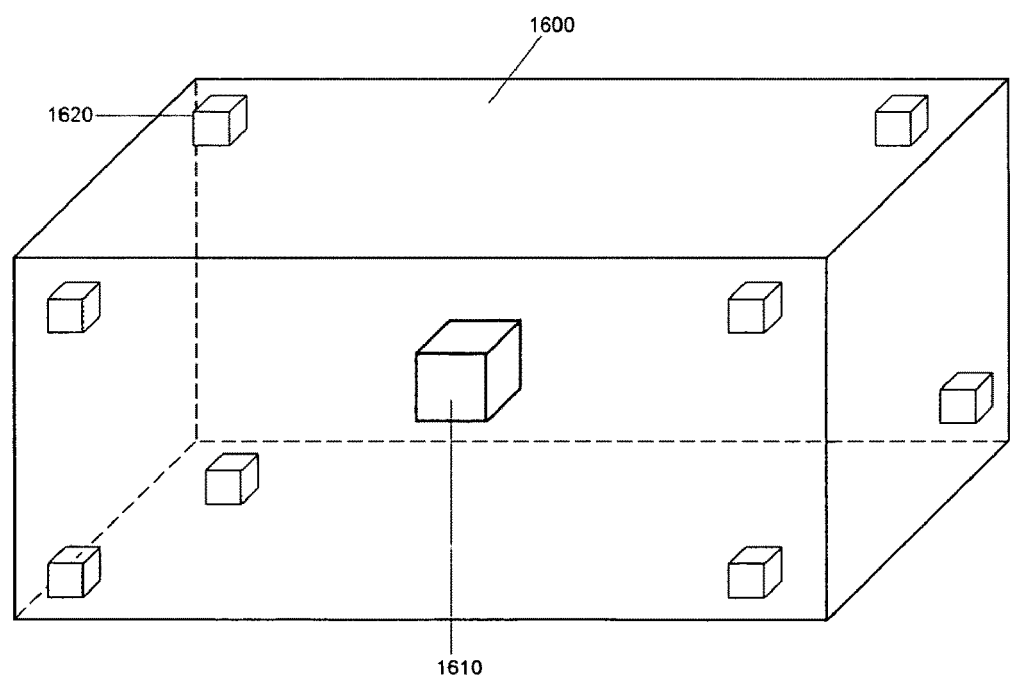
FIG. 16 is a schematic drawing of an oblong configuration of a 3D SoC with cubic structured nodes.

FIGS. 15 and 16 show a 3D SoC in an oblong configuration. In FIG. 15, the oblong SoC also features oblong IC nodes, (805 and 835). In FIG. 16, the oblong SoC features cubic IC nodes (1620 and 1610).

Figure 17:
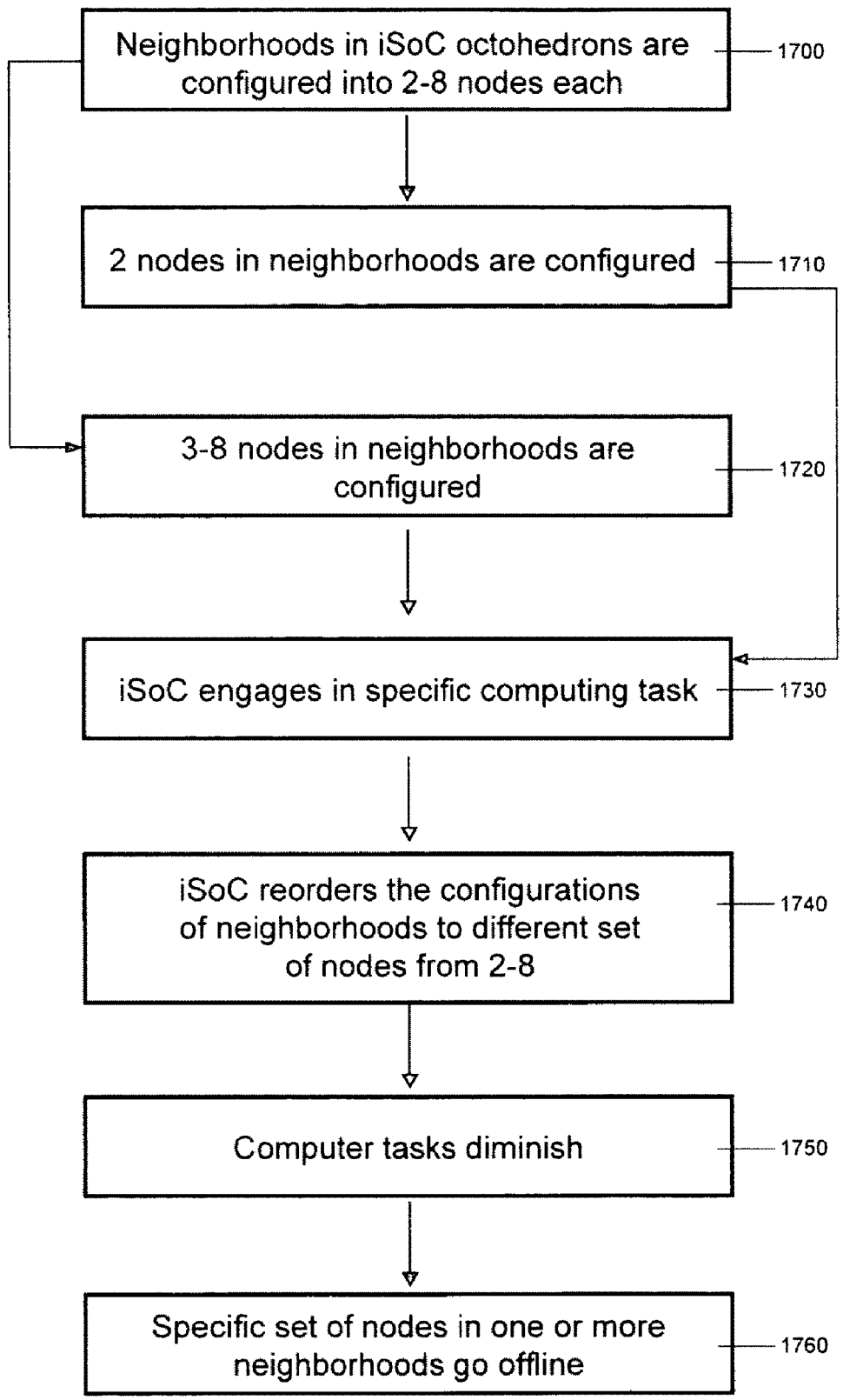
FIG. 17 is a flow chart describing the variable configuration process of neighborhood nodes in a 3D SoC.

FIG. 17 is a flow chart showing the variable configuration process of neighborhood nodes in a 3D SoC. Neighborhoods in iSoC octahedrons are configured into sets of 2 to 8 nodes each (1700). The clusters of nodes are configured into 2 nodes (1710) or 3-8 nodes (1720). Whether configured as 2 nodes or as 3 to 8 nodes, the clusters engage in a specific computing task (1730) in the iSoC. The iSoC then reorders the configurations of the neighborhoods to different sets of nodes from 2 to 8 nodes (1740). As the computer tasks diminish (1750), the specific set of nodes in one or more neighborhood clusters then go offline (1760).

FIG. 18 is a chart specifying the transistor type used in multiple types of ICs used in the 3D iSoC. Planar transistors are used in ASICs and FPGAs. Planar 2-gate transistors are used in memory devices and in microprocessors. 3D FinFETs and 3D tri-gate transistors are used in 3D memory, 3D microprocessors and 3D FPGAs.

FIG. 19 is a chart indicating the specifications of the tiles and layers of a 3D IC. Each tile has 22, 25, 39 or 70 transistors in a single row. The virtual layers are configured with 484, 625, 1521 and 4700 transistors in a single row. Each real layer consists of 9 virtual layers. Each node consists of 12 real layers. In nodes with virtual layers, this totals 108 layers. The total number of transistors in each node then ranges from 25.3M, 42.2M, 27.76M and 288M in the different configurations. The total number of transistors in each configuration of a 3D iSoC is 885M, 1.476B, 971.65M and 10.08 B, respectively.

FIG. 20 is a chart showing the main uses of three types of 3D IC applications. Over several generations, the semiconductor fabrication processes produce smaller transistor sizes, which increases the computational efficiencies of the ICs used in the iSoC. The economy version of the iSoC is used for embedded controllers. The standard version is used for DSP applications. The high performance version is used for modeling and scientific applications.

Figure 21:
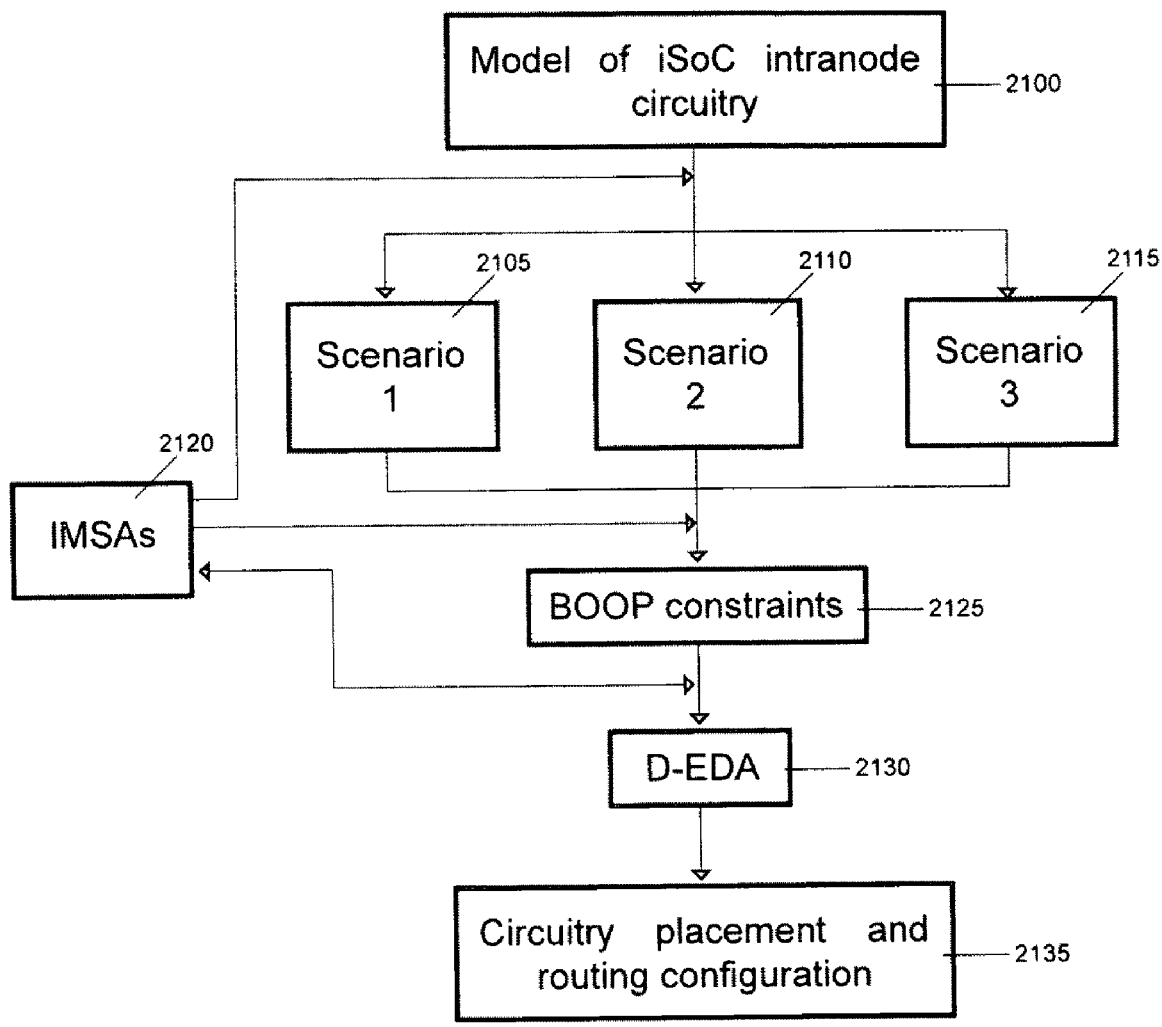
FIG. 21 is a flow chart showing the modeling process for 3D iSoC circuitry.

FIG. 21 is a flow chart showing the modeling process for 3D iSoC circuitry. After a model is generated of iSoC intranode circuitry (2100), several scenarios are created (2105, 2110 and 2115) by IMSAs (2120). The scenarios are organized within BOOP constraints (2125) and lead to the organization of dynamic EDA (2130) architectures, which then is organized into a circuitry placement and routing configuration (2135).

Figure 22:
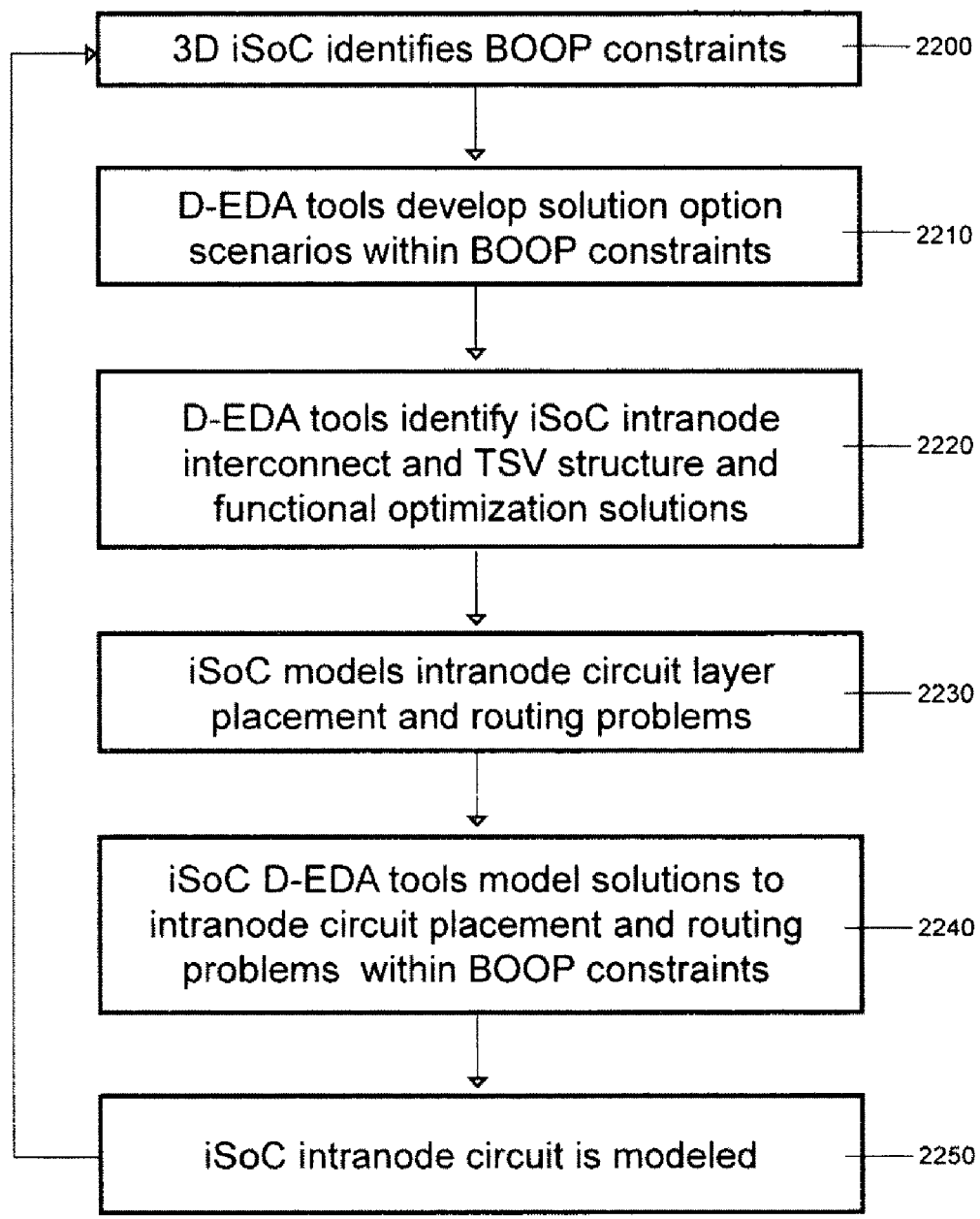
FIG. 22 is a flow chart showing the process of using EDA tools to model a 3D iSoC.

FIG. 22 is a flow chart showing the process of using EDA tools to model a 3D iSoC. After a 3D iSoC identifies BOOP constraints (2200), D-EDA tools develop solution option scenarios within the BOOP constraints (2210). The D-EDA tools then identify iSoC intranode interconnect and TSV structure and functional optimization solutions (2220) and the iSoC models the intranode circuit layer placement and routing problems (2230). The iSoC D-EDA tools model solutions to intranode circuit placement and routing problems within BOOP constraints (2240). The iSoC intranode circuit is then modeled (2250).

Figure 23:
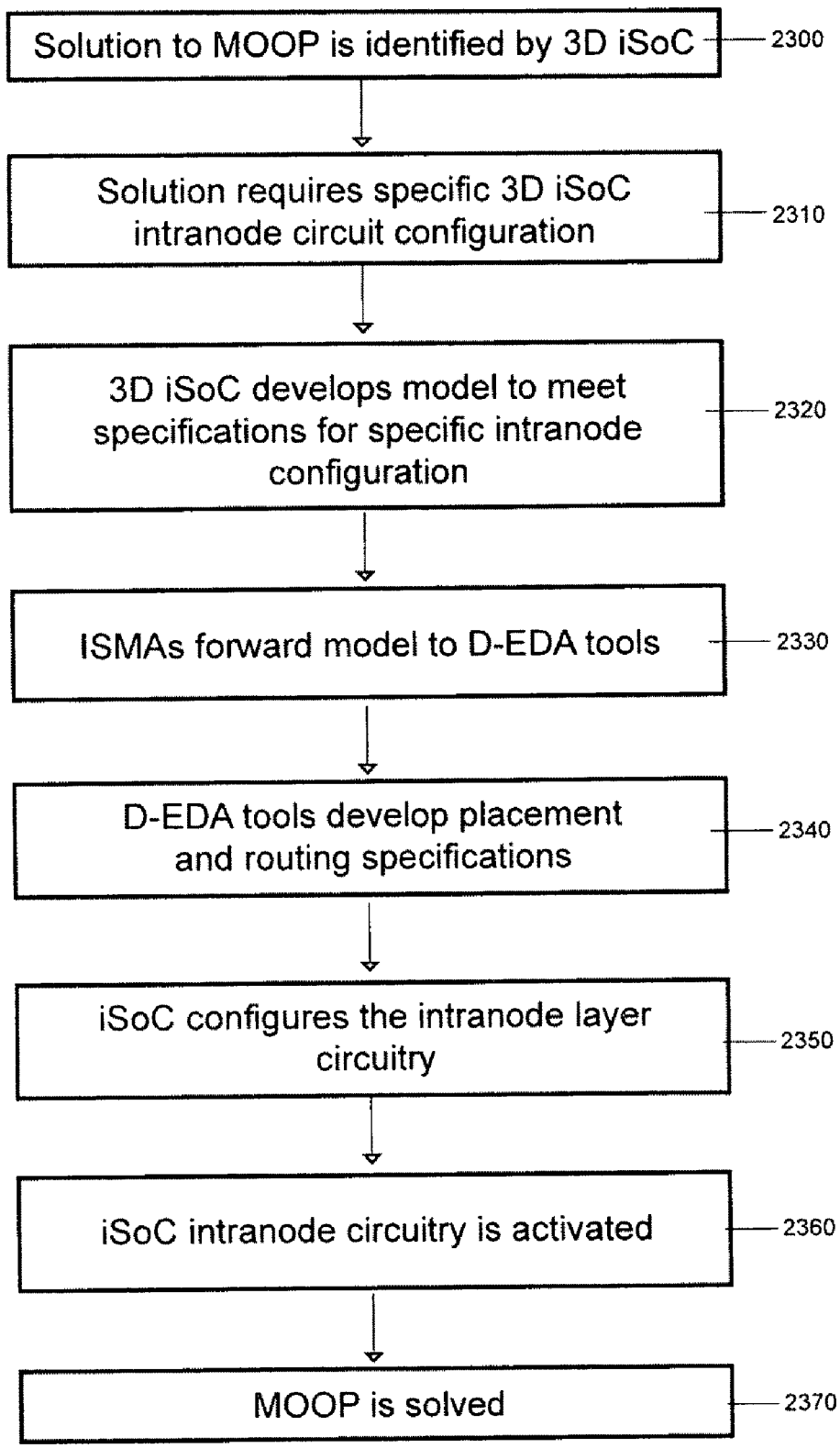
FIG. 23 is a flow chart showing the reverse engineering process of 3D iSoc intranode layer circuitry.

FIG. 23 is a flow chart showing the reverse engineering process of 3D iSoC intranode layer circuitry. Once a MOOP is identified by a 3D iSoC (2300), the solution requires a specific 3D iSoC intranode circuit configuration (2310). The 3D iSoC develops a model to meet the specifications for a specific intranode configuration (2320) and IMSAs forward the model to D-EDA tools (2330), which develop placement and routing specifications (2340). The iSoC configures the intranode layer reconfigurable circuitry (2350), the circuitry is activated (2360) and the MOOP is solved (2370).

Figure 24:
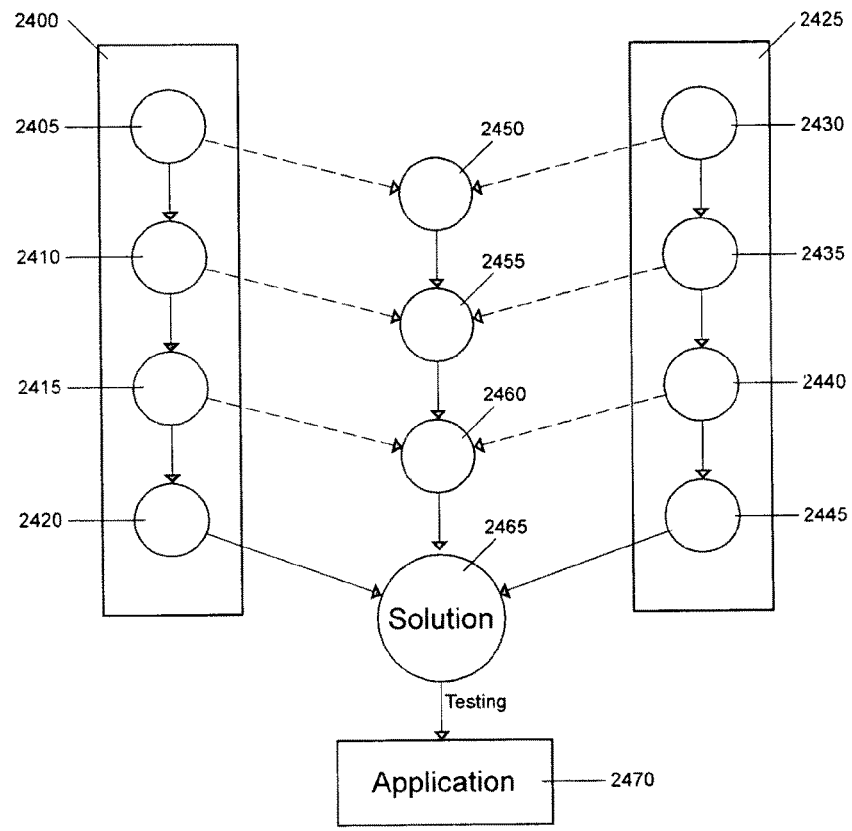
FIG. 24 is a schematic drawing showing the process of developing solution options between two opposing trade-offs.

In FIG. 24, the process of developing solution options between two opposing trade-offs is shown. Between one field (2400) of constraints (2405, 2410, 2415 and 2420) and another field (2425) of constraints (2430, 2435, 2440 and 2445), the solution options (2450, 2455, 2460 and 2465) are sequentially organized and tested before they are used in a specific application (2470). In general, the constraints are determined by conditions in an evolving environment.

Figure 25:
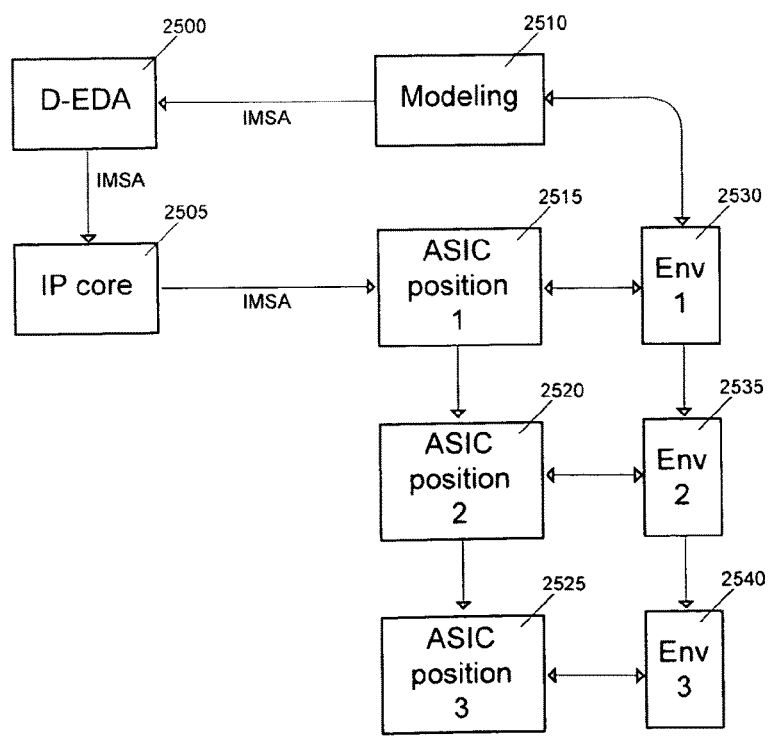
FIG. 25 is a schematic drawing showing the design method to organize the dynamic reconfigurable system as it interacts with the environment.

FIG. 25 shows the design method to organize the dynamic reconfigurable system as it interacts with the environment. With the assistance of IMSAs, models are generated (2510) to organize D-EDA (2500) designs to configure IP cores (2505) in order to apply to an FPGA to structure into specific ASIC positions (2515, 2520 and 2525). At each stage of reconfiguration, the ASICs and the modeling process interacts with different stages of an evolving environment.

Figure 26:
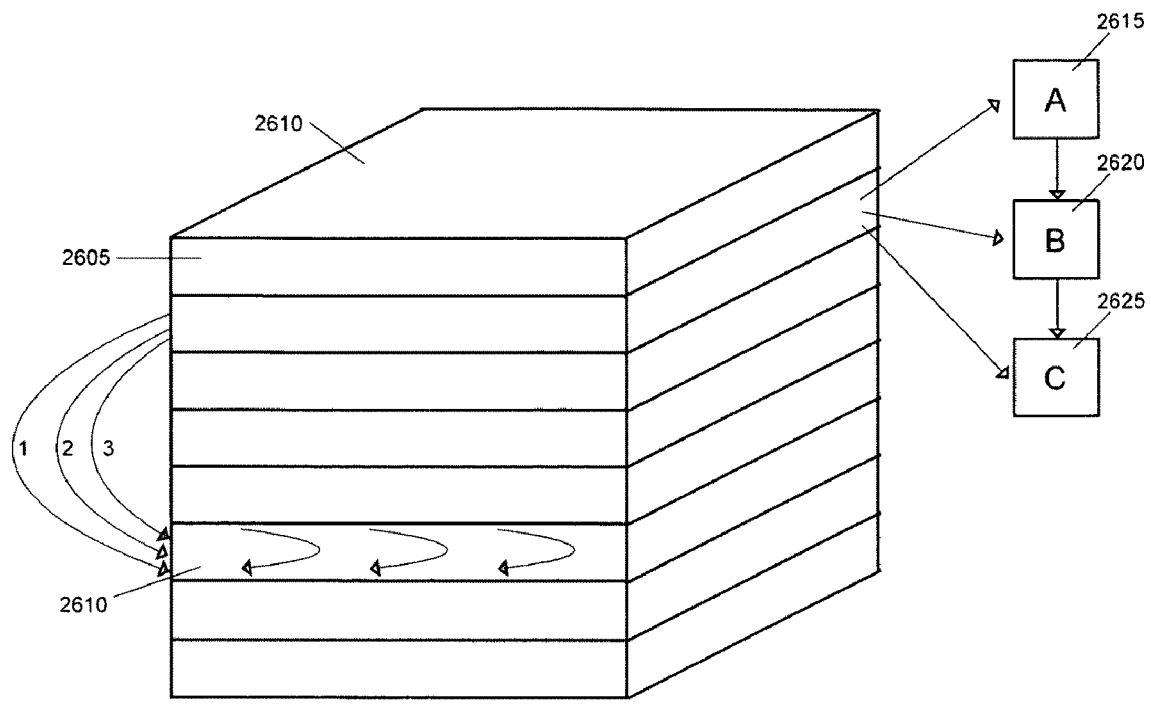
FIG. 26 is a schematic drawing showing a 3D IC node's three phases of layer 2 modeling and reconfiguring layer 6 for application structure as layer 2 interacts with an evolving environment.
Figure 27:
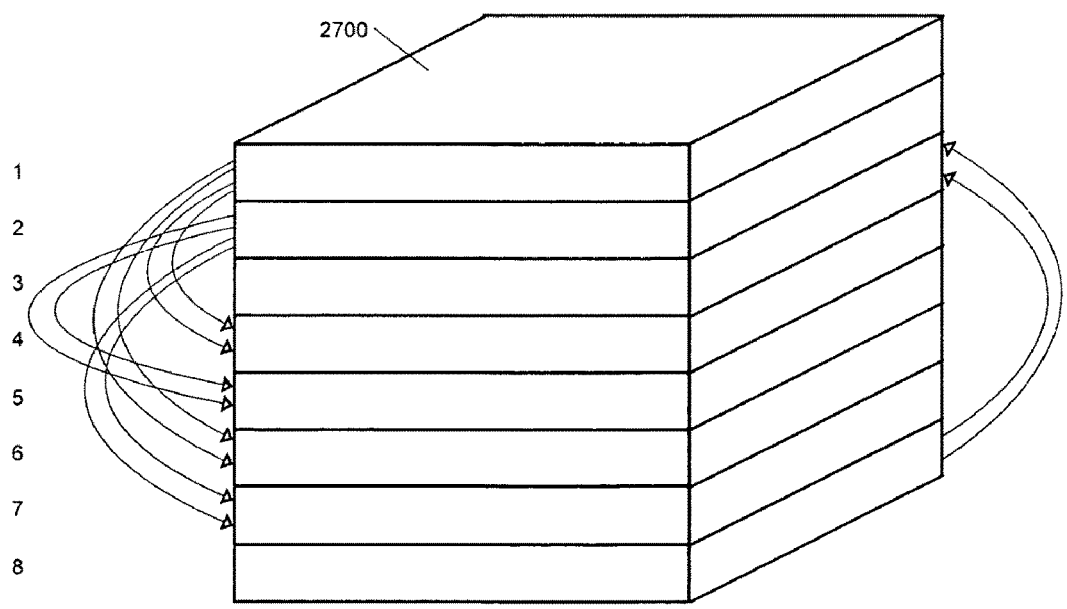
FIG. 27 is a schematic drawing showing a 3D IC node's top two layers model and reconfigure layers 4, 5, 6 and 7 while layer 8 models and reconfigures layer 3.

FIGS. 26 and 27 show the modeling of a node's reconfigurable layers by other layers in a node. FIG. 26 shows a 3D IC node's three phases of layer 2 (2605) modeling and reconfiguring layer 6 (2610) for application structure configuration as layer 2 interacts with an evolving environment, shown in three phases (2615, 2620 and 2625). FIG. 27 shows a 3D IC node's (2700) top two layers model and reconfigure layers 4, 5, 6 and 7 while layer 8 models and reconfigures layer 3.

Figure 28:
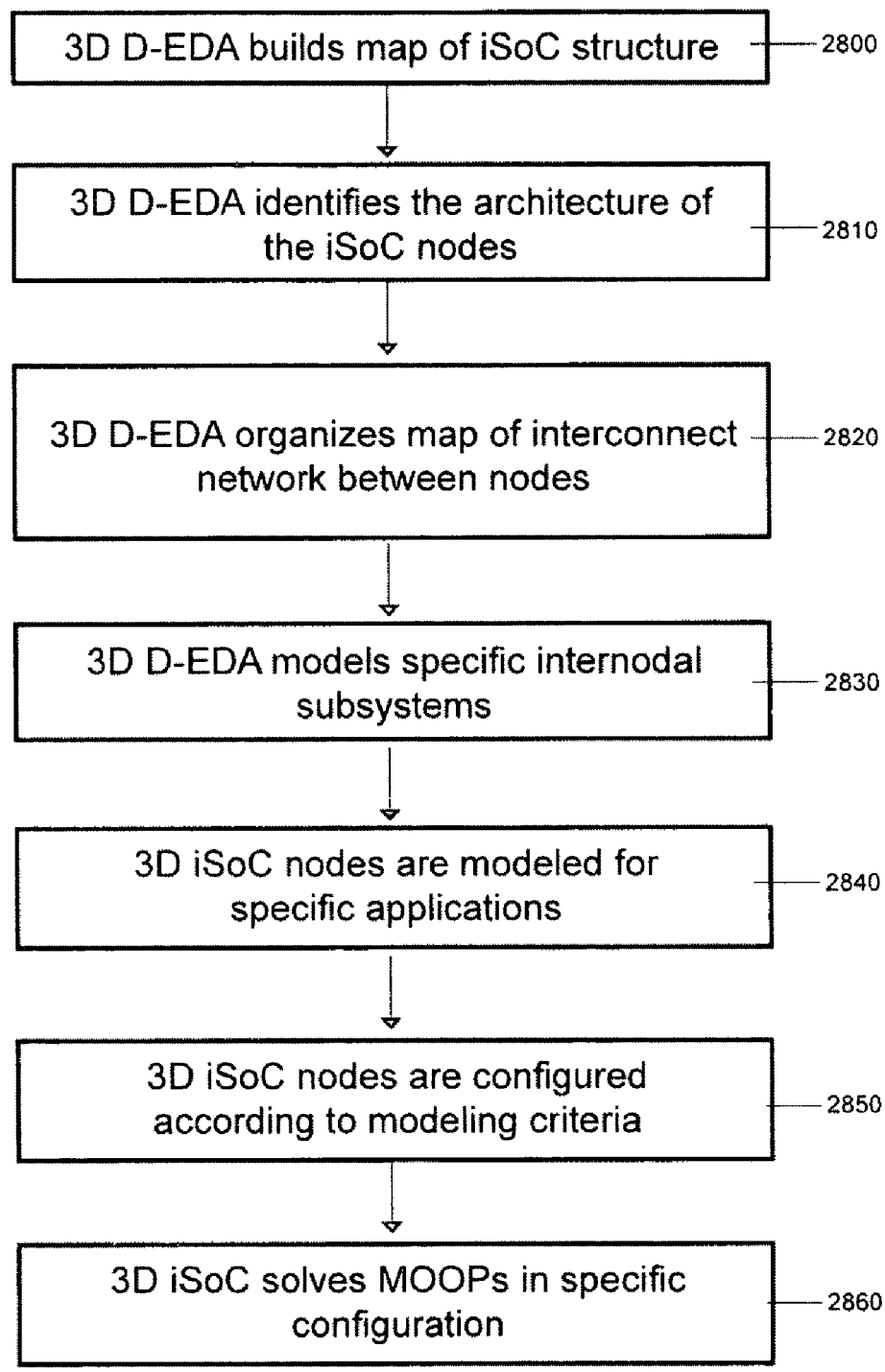
FIG. 28 is a flow chart showing the modeling process of a 3D iSoC to solve MOOPs.

FIG. 28 shows the modeling process of a 3D iSoC to solve MOOPs. After a 3D D-EDA builds an initial map of an iSoC structure (2800), the D-EDA identifies the architectures of the iSoC nodes (2810). The 3D D-EDA organizes a map of the interconnect network between nodes (2820) and models specific internodal subsystems (2830). The 3D iSoC nodes are modeled for specific applications (2840) and the nodes are configured according to modeling criteria (2850). The 3D iSoC then solves MOOPs in a specific configuration (2860).

Figure 29:
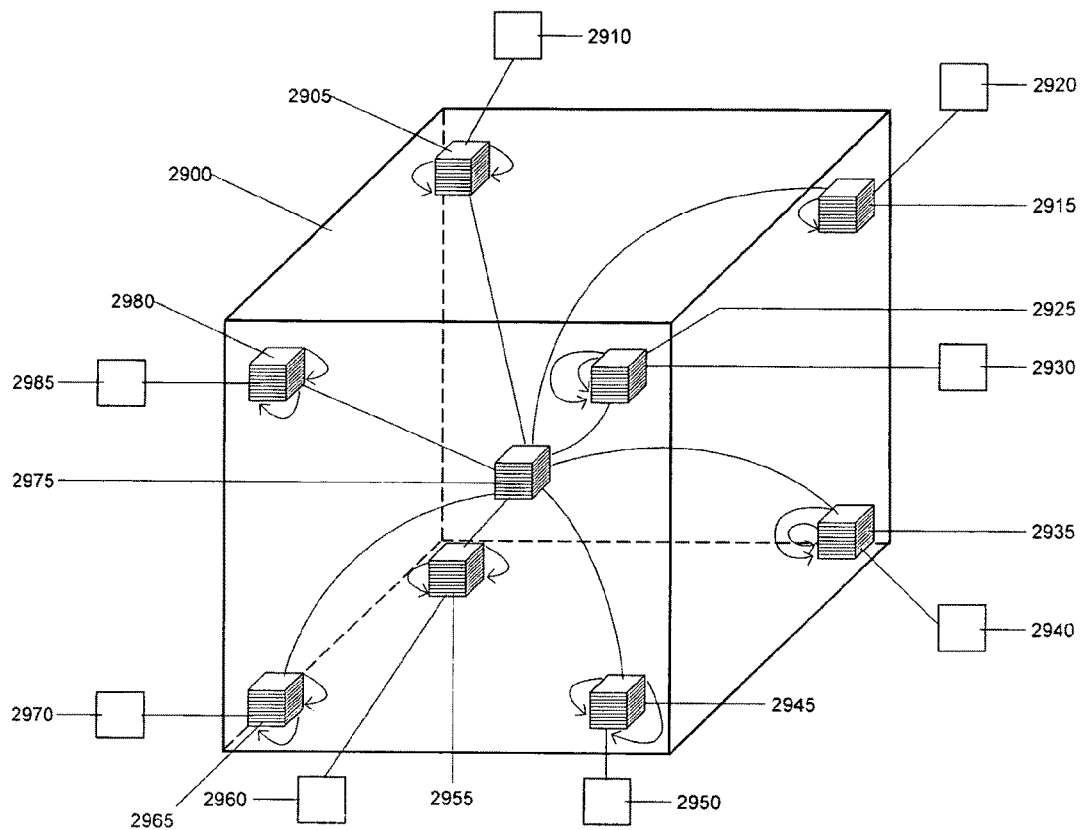
FIG. 29 is a schematic diagram showing the reconfiguration of nodes in a 3D iSoC with the interaction of nodes with external applications.

FIG. 29 shows the reconfiguration of nodes in a 3D iSoC with the interaction of nodes with external applications. In this drawing, each of the multilayer nodes (2905, 2915, 2925, 2935, 2945, 2955, 2965 and 2980) in the corners of the 3D iSoC (2900) is shown reorganizing their configurations. Each neighborhood node is connected to the central node (2975). Each node is also connected to external devices (2910, 2920, 2930, 2940, 2950, 2960, 2970 and 2985) which provide feedback to stimulate reconfigurable behaviors.

Figure 30:
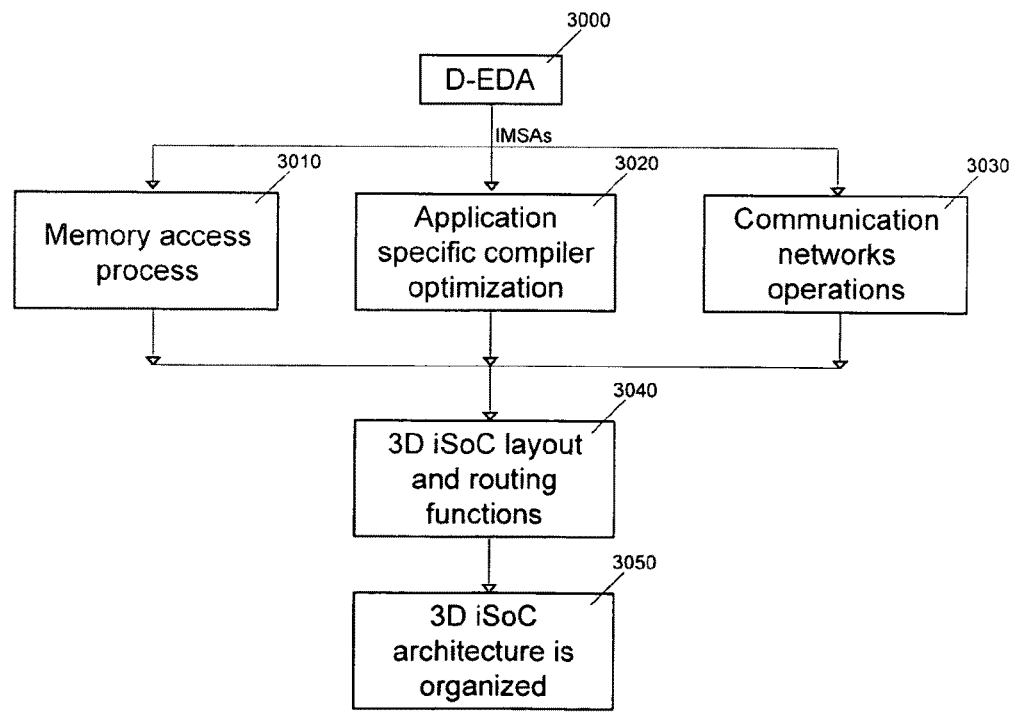
FIG. 30 is a flow chart showing the EDA process to organize a 3D iSoC architecture.

FIG. 30 is a flow chart showing the EDA process used to organized a 3D iSoC architecture. The D-EDA system (3000) uses IMSAs to organize the 3D architectural configurations of memory access processes (3010), application specific compiler optimization (3020) and communication network operations (3030). The system then proceeds to the 3D iSoC layout and routing functions (3040) and the 3D iSoC architecture is organized (3050).

Figure 31:
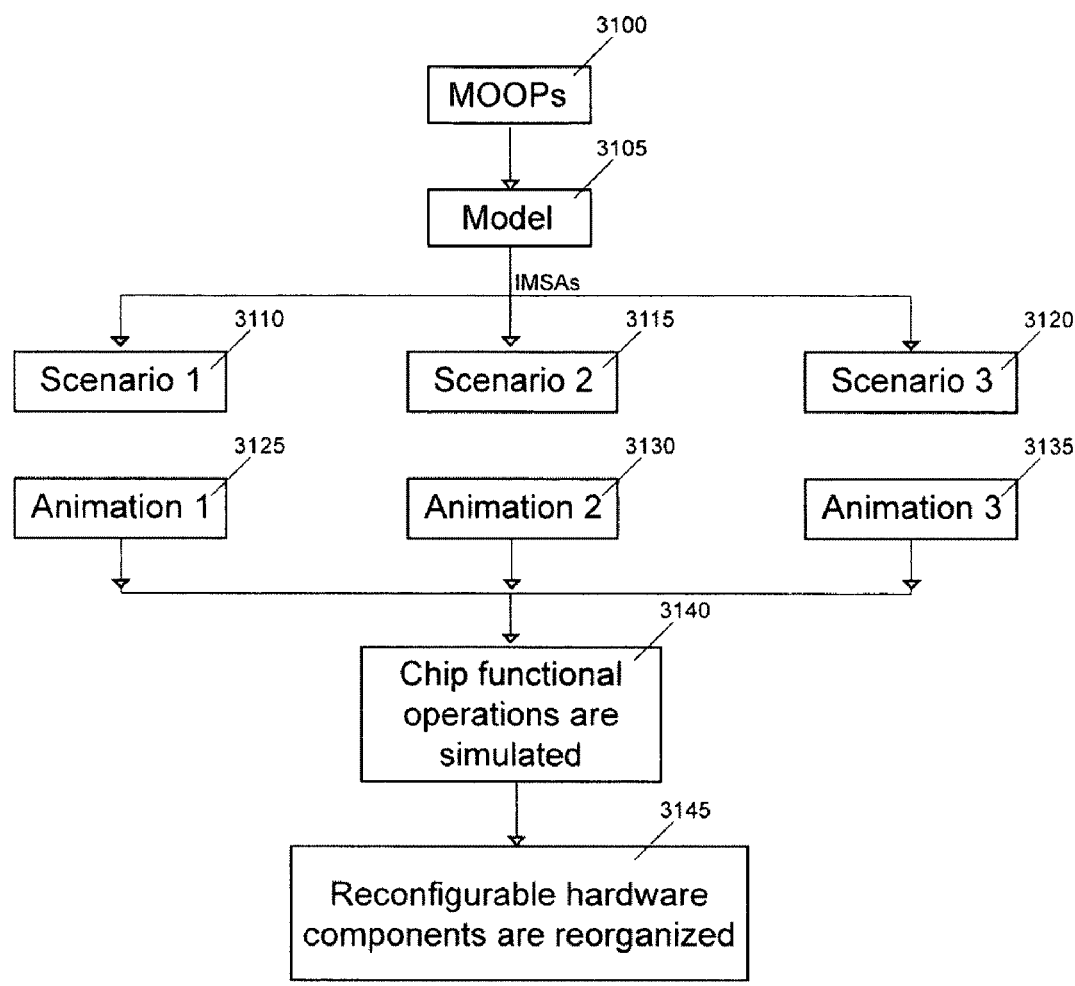
FIG. 31 is a flow chart showing the modeling process of reconfigurable hardware.

FIG. 31 is a flow chart illustrating the modeling process of reconfigurable hardware. Within MOOPs constraints (3100), the system develops a model (3105) with multiple scenarios (3110, 3115 and 3120) and animations (3125, 3130 and 3135). The chip functional operations are simulated (3140) and reconfigurable hardware components are reorganized (3145).

Figure 32:
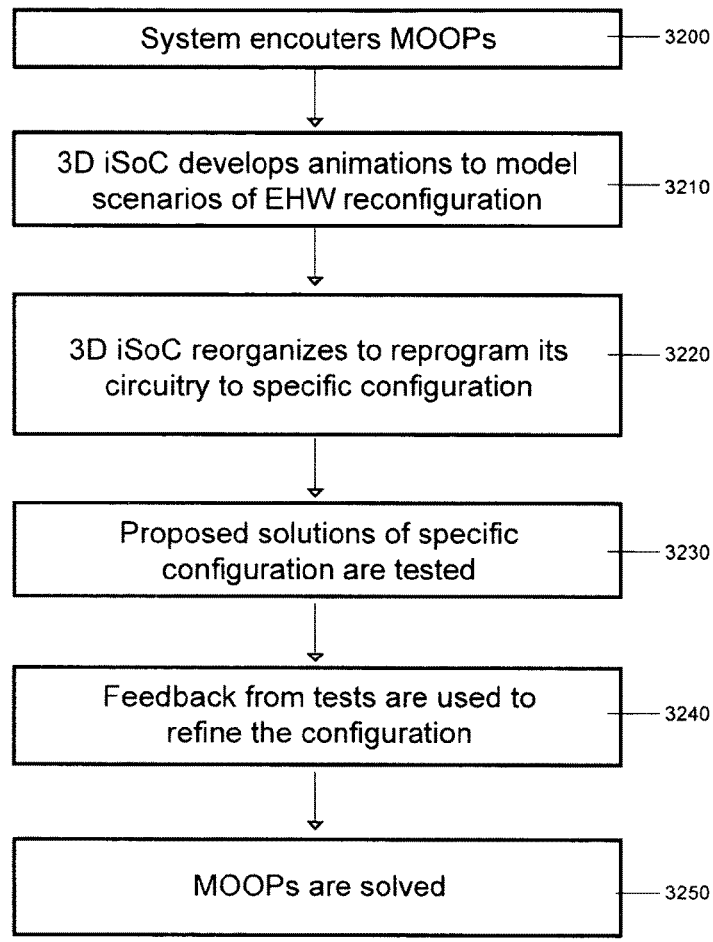
FIG. 32 is a flow chart showing the reconfiguration testing process in a 3D iSoC.

FIG. 32 is a flow chart showing the reconfiguration testing process in a 3D iSoC. After the system encounters MOOPs (3200), the 3D iSoC develops animations to model scenarios of EHW reconfiguration (3210). The 3D iSoC reorganizes its circuitry to a specific configuration (3220) and proposed solutions of specific configurations are tested (3230). The feedback from tests are used to refine the configuration (3240) and the MOOPs are solved (3250).

Figure 33:
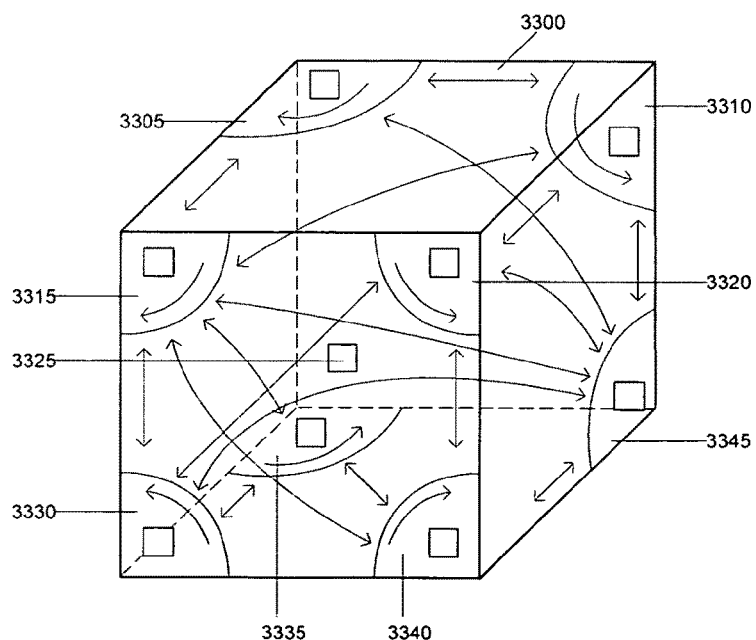
FIG. 33 is schematic diagram showing the process in a 3D iSoC of each neighborhood cluster modeling its own reconfiguration and interaction with other clusters.

FIG. 33 shows the process in a 3D iSoC (3300) of each neighborhood cluster modeling its own reconfiguration and interaction with other clusters. Each neighborhood cluster (3305, 3310, 3315, 3320, 3330, 3335, 3340 and 3345) of nodes is shown in the corners of the cube in the process of restructuring its configurations. Each cluster interacts with other clusters for dynamic performance.

Figure 34:
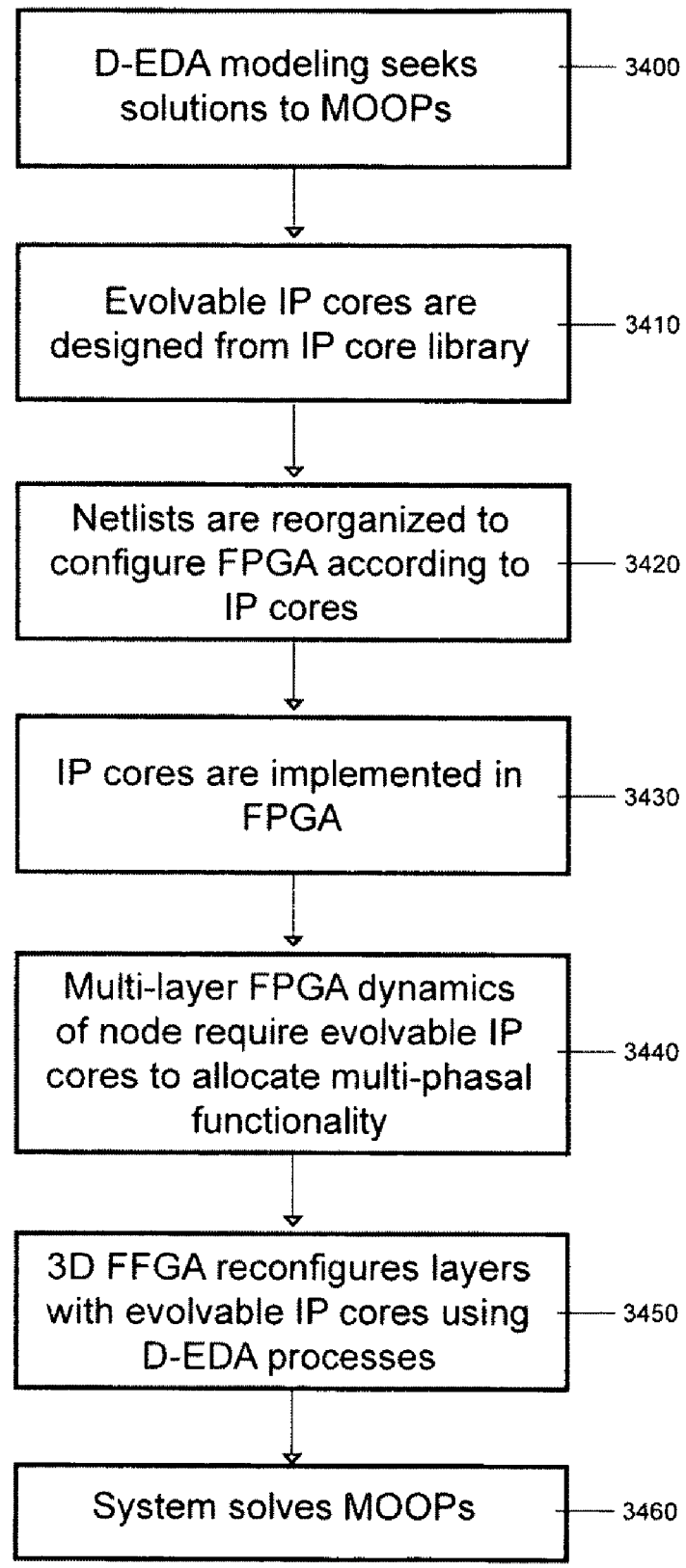
FIG. 34 is a flow chart showing the process of IP cores applied and tuned in a 3D FPGA with D-EDA modeling.

FIG. 34 is a flow chart illustrating the process of utilizing IP cores applied and tuned in a 3D FPGA with D-EDA modeling. After the D-EDA modeling system seeks solutions to MOOPs (3400), evolvable IP cores are designed from the IP core library (3410). Netlists are reorganized to configure FPGAs according to the IP core architectures (3420) and the IP cores are implemented in an FPGA (3430). The multilayer FPGA dynamics of a node require evolvable IP cores to allocate multi-phasal functionality (3440) and the 3D FPGA reconfigures layers with evolvable IP cores using D-EDA processes (3450). The system then solves the MOOPs (3460) in its revised configuration.

FIG. 35 is a flow chart showing the process of an initial 3D iSoC programming process. The 3D iSoC is initially inert (3500) prior to the D-EDA process modeling the 3D iSoC for specific functionality (3510). The static initial configuration of the iSoC is reconfigured (3520) and the dynamic program configurations are provided (3530). Once environmental constraints and feedback are factored into the model (3540), the 3D iSoC is tuned and the programming dynamics are refined (3550).

FIG. 36 is a flow chart showing the auto-programming process of a 3D iSoC. After the 3D iSoC generates simulations of scenarios (3600), the D-EDA modeling system constructs 3D animations of scenario simulations (3610) using IMSAs. The 3D iSoC generates evolutionary IP cores (3620) and FPGA layers of reconfigurable nodes are reprogrammed (3630). The 3D iSoC interacts with its environment and receives feedback (3640) and performs tasks to solve MOOPs (3650).

Figure 37:
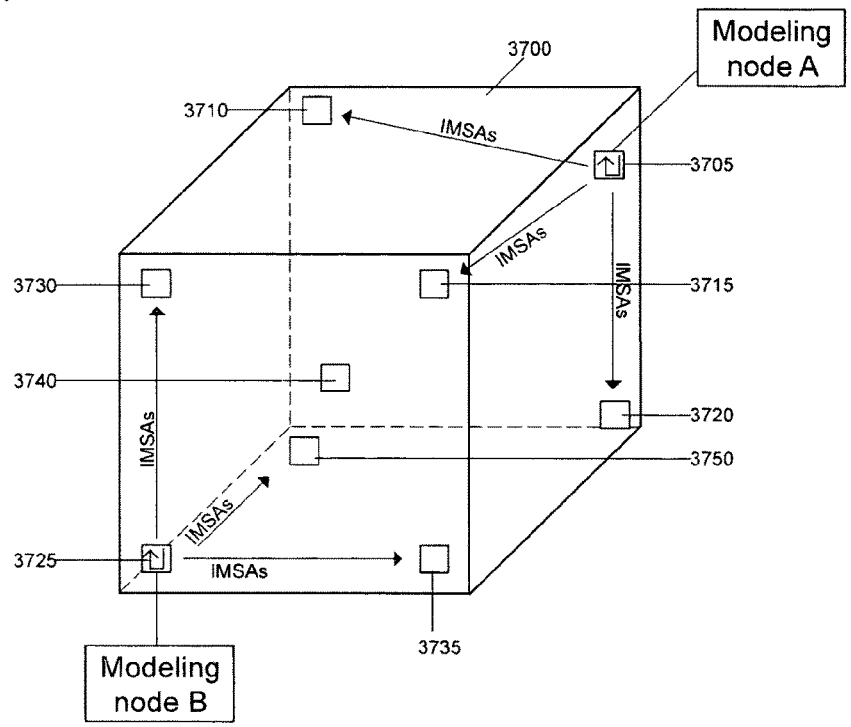
FIG. 37 is a schematic diagram showing how two specific 3D IC nodes in a 3D iSoC model other node reconfiguration using IMSAs.

FIG. 37 shows how two specific 3D IC nodes in a 3D iSoC model other node reconfiguration processes using IMSAs. The nodes at 3705 and 3725 model other nodes at 3710, 3715 and 3720 as well as at 3730, 3735 and 3750. The modeling nodes use IMSAs to interact with other nodes.

Figure 38:
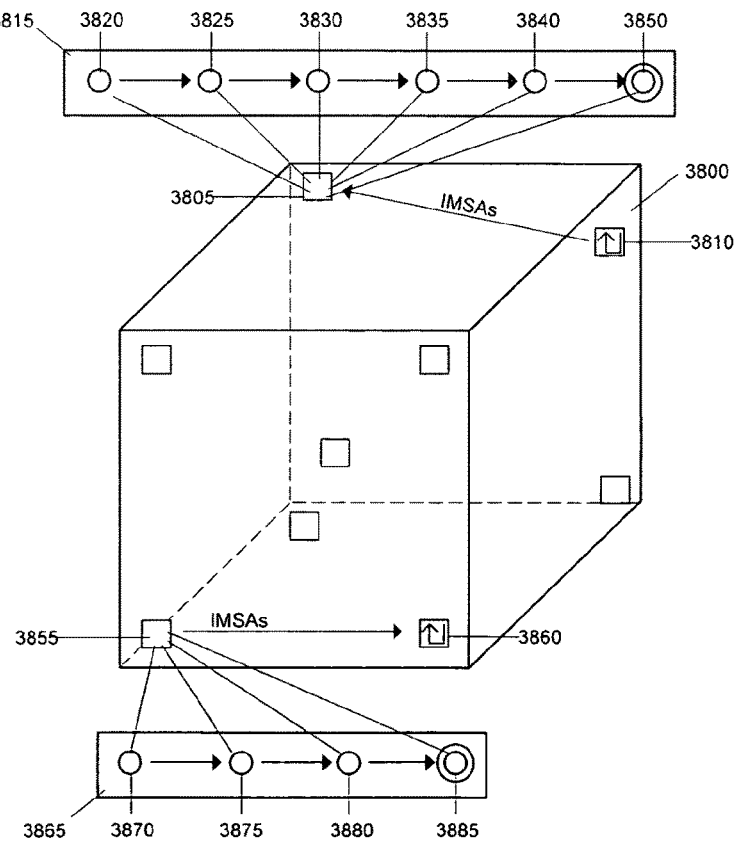
FIG. 38 is a schematic diagram showing how two specific 3D IC nodes in a 3D iSoC model other nodes that interact with an evolving environment.

FIG. 38 shows how two specific 3D IC nodes in a 3D iSoC (3800) model other nodes that interact with an evolving environment. The node at 3810 models the node at 3805 with IMSAs as it interacts with an evolving environment (3815) at phases 3820, 3825, 3830, 3835, 3840 and 3850. The solution is reached to solve MOOPs at 3850. Similarly, the node at 3860 models the node at 3855 with IMSAs as it interacts with an evolving environment (3865) at phases 3870, 3875, 3880 and 3885 (solution to MOOPs).

Figure 39:
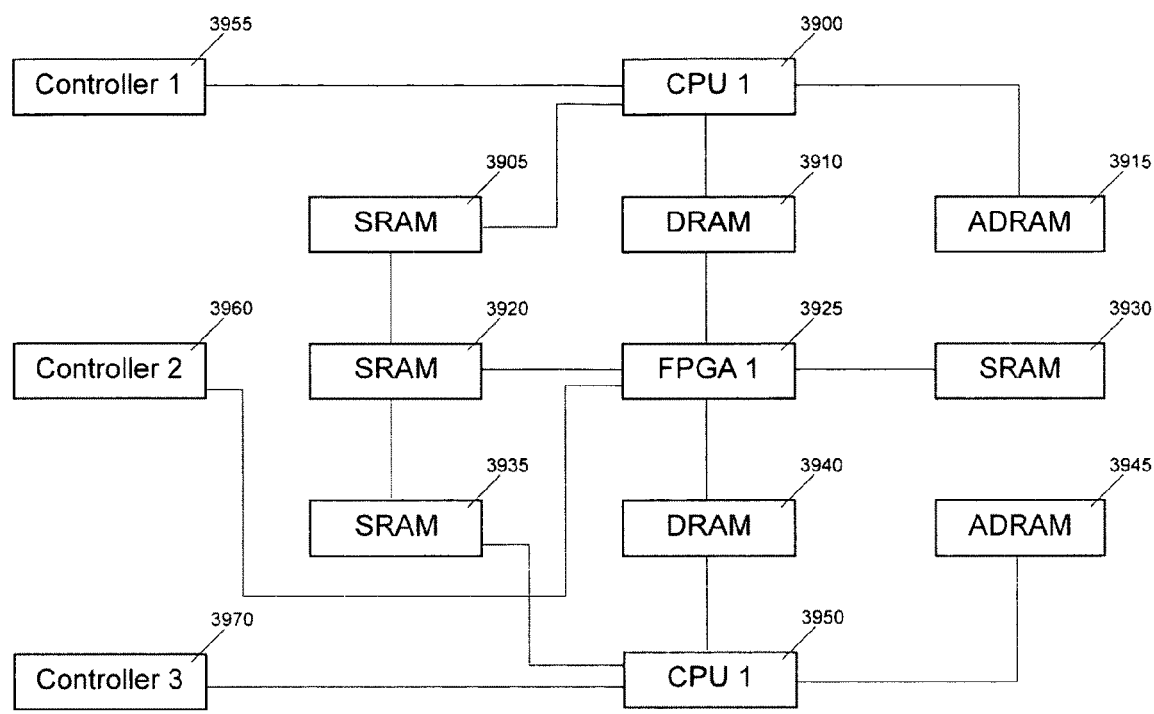
FIG. 39 is a block diagram of five layers of a node.

FIG. 39 shows five layers of a node, with a microprocessor CPU layer (3900), a memory layer (SRAM, DRAM and ADRAM at 3905, 3910 and 3915), an FPGA layer (3925) with adjacent SRAM components (3920 and 3930), another memory layer (SRAM, DRAM and ADRAM at 3935, 3940 and 3945) and a microprocessor CPU layer (3950). This set of IC layers is connected to three controllers (3955, 3960 and 3970) for specific applications.

Figure 40:
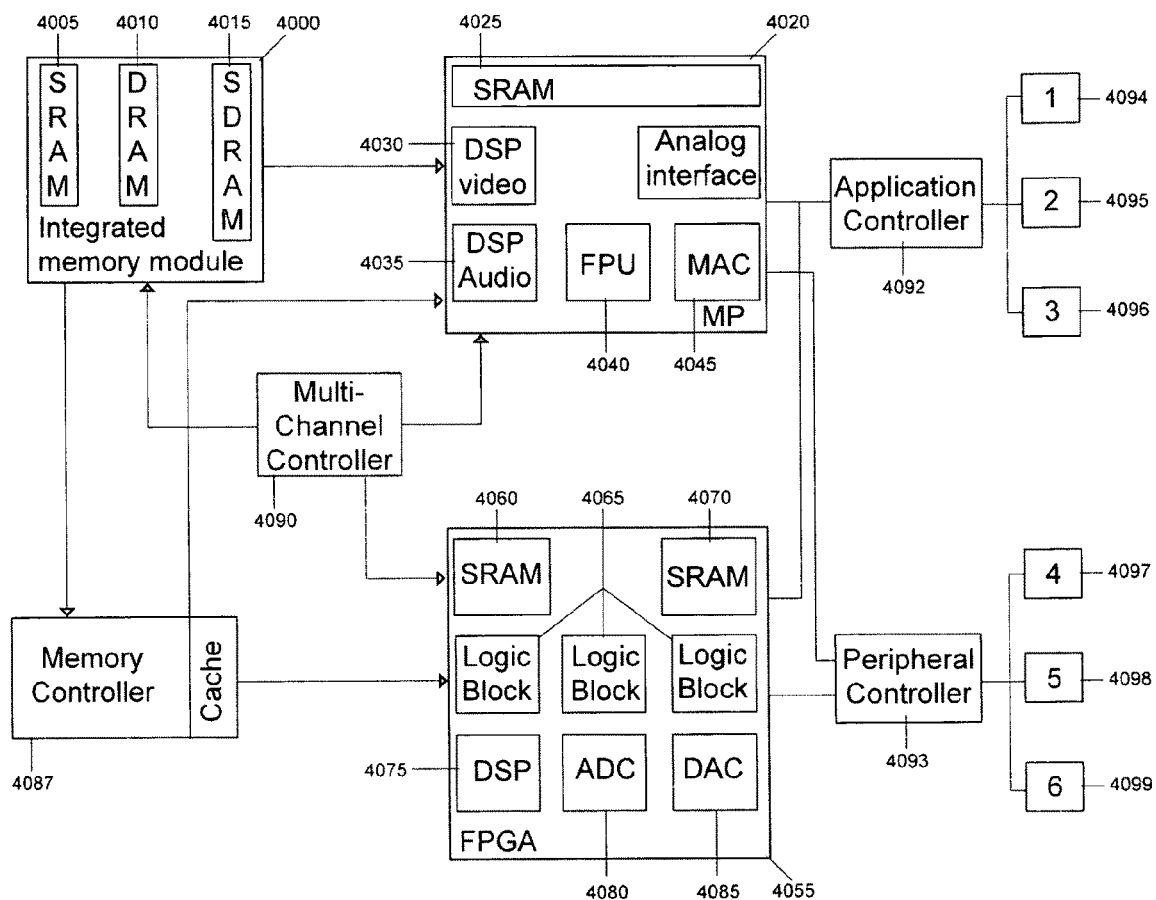
FIG. 40 is block diagram of a MP, FPGA and integrated memory module within a 3D iSoC IC node.

FIG. 40 shows a MP (4020), FPGA (4055) and integrated memory module (4000) within a 3D iSoC IC node. These main components are connected to a multi-channel controller (4090) and to a memory controller (4087). The logic devices are connected to an application controller (4092) and to a peripheral controller (4093), each of which are connected to external applications (4094, 4095 and 4096 and 4097, 4098 and 4099, respectively).

Figure 41:
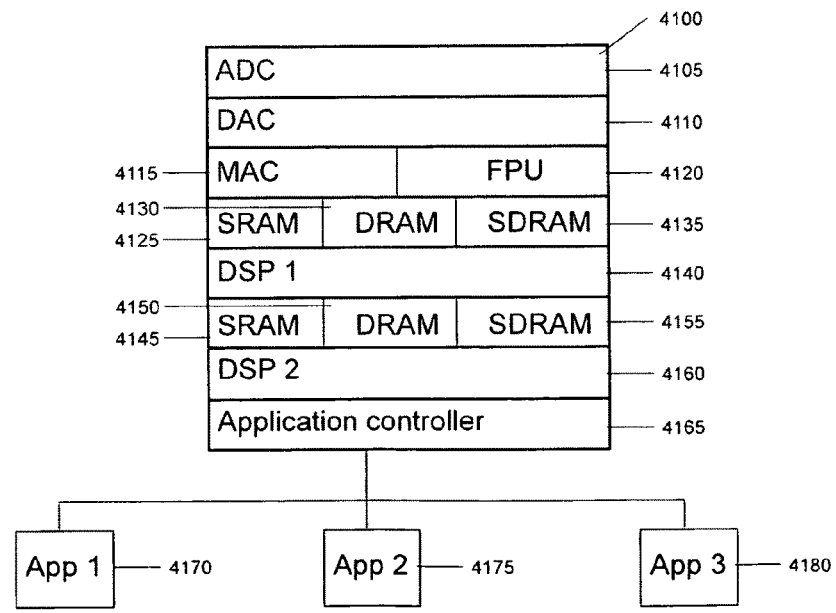
FIG. 41 is a block diagram of a 3D IC node configuration for DSP applications.

FIG. 41 shows a 3D IC node configuration for DSP applications. An analog to digital converter is on the first layer (4105) and a digital to analog converter is on the second layer (4110). A MAC and FPU are on tiles of the third layer (4120). Integrated memory layers are at layers four (4135) and six (4155). Digital signal processors are at layers five (4140) and seven (4160). The application controller is at layer eight (4165) connected to external application devices (4170, 4175 and 4180).

Figure 42:
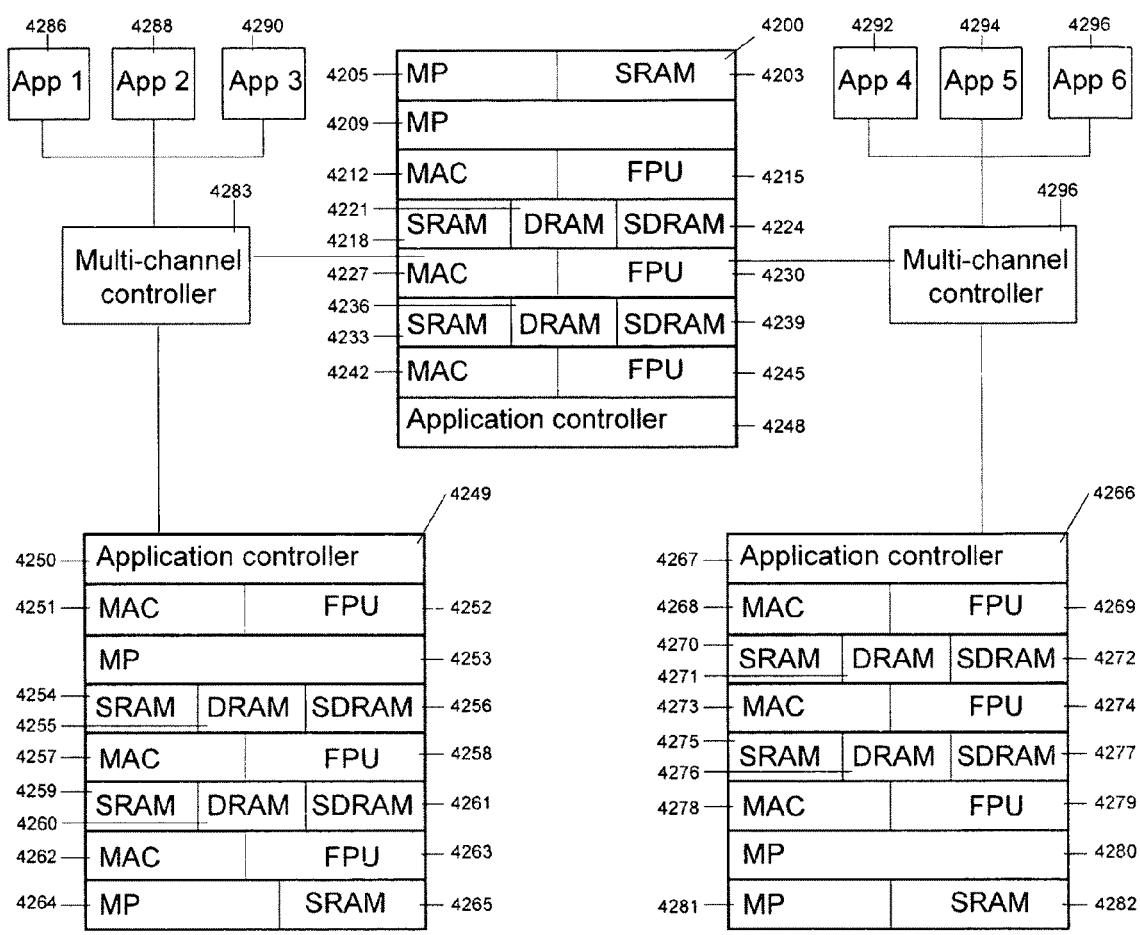
FIG. 42 is a block diagram of three 3D IC nodes interacting for a modeling application.

FIG. 42 shows three 3D IC nodes interacting for a modeling application. Each node is configured for heavy use of arithmetic computation and memory access. The nodes are connected to multi-channel controllers (4283 and 4284), which are connected to specific applications devices (4286, 4288, 4290, 4292, 4294 and 4296).

Figure 43:
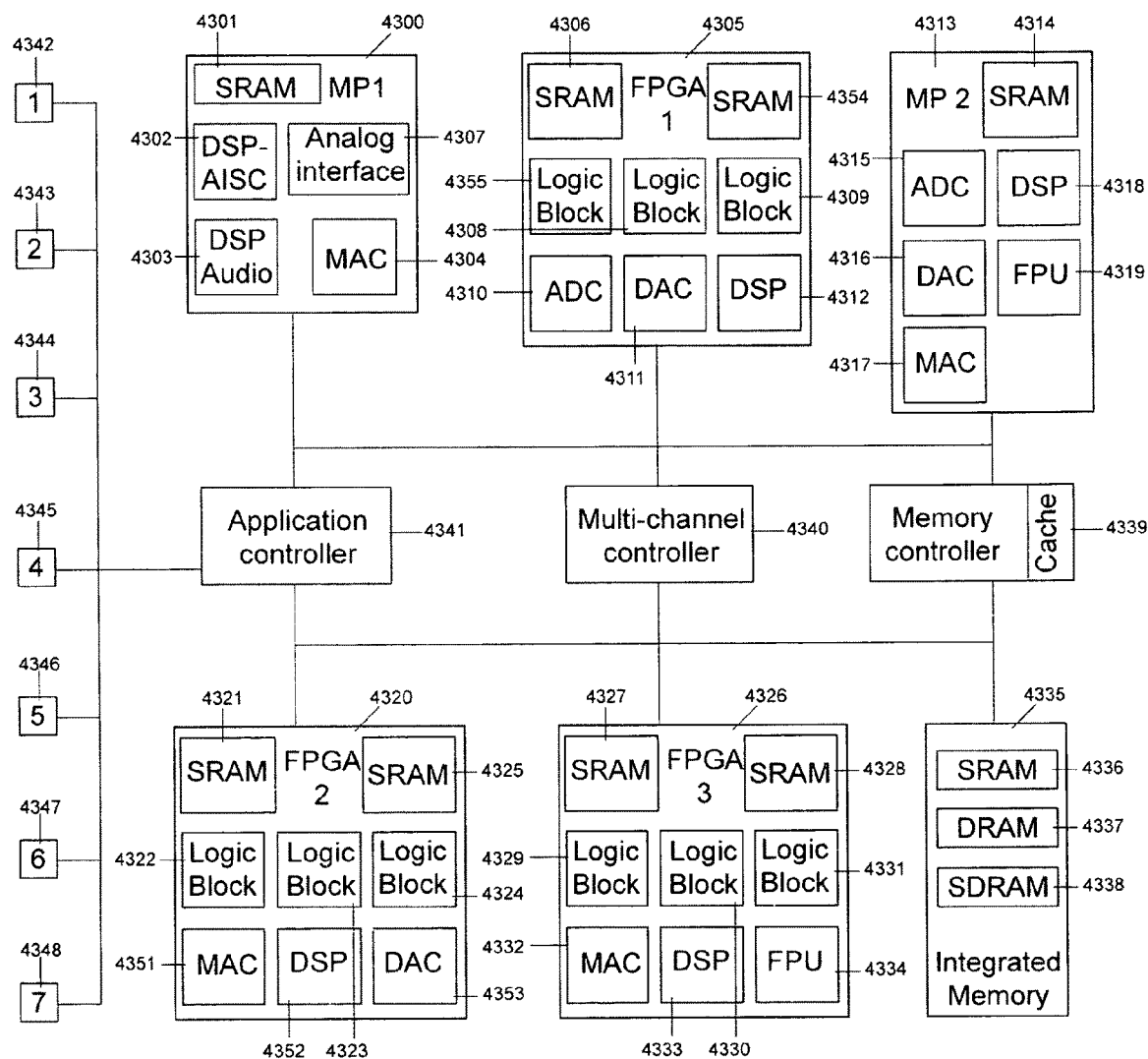
FIG. 43 is a block diagram of six 3D IC nodes interacting for multifunctional (arithmetic and DSP) applications.

FIG. 43 shows six 3D IC nodes interacting for multifunctional (arithmetic and DSP) applications. Two microprocessors (4300 and 4313) are linked in a network with three FPGAs (4305, 4320 and 4326) and an integrated memory module (4335). The network is connected to a memory controller (4339), multi-channel controller (4340) and an application controller (4341), the latter of which is connected to seven application devices.

Figure 44:
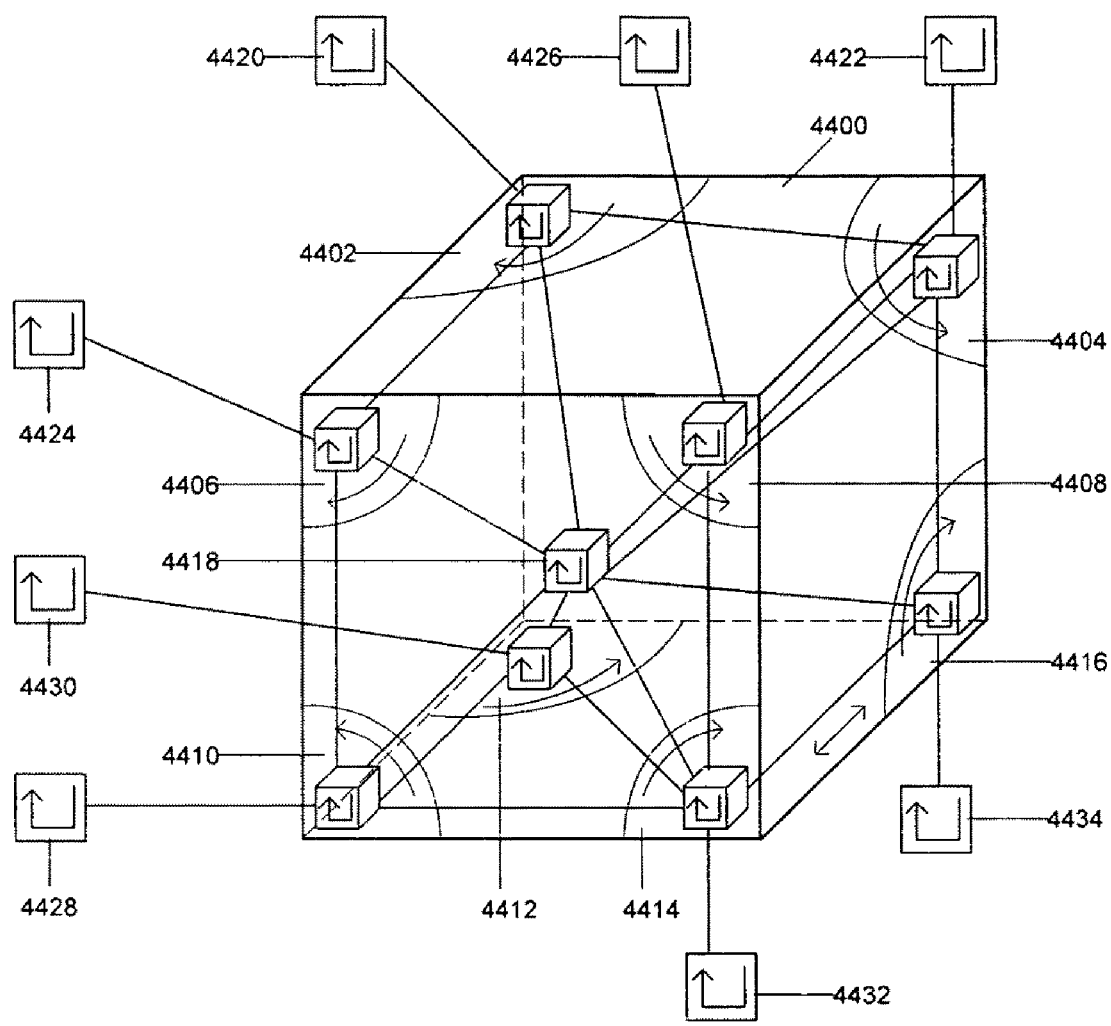
FIG. 44 is a schematic drawing of an interconnected 3D iSoC with transforming reconfigurable nodes interacting with evolving applications in the environment.

FIG. 44 shows an interconnected 3D iSoC with transforming reconfigurable nodes interacting with evolving applications in the environment. The nodes in the corners of the 3D iSoC are shown restructuring the configurations of the neighborhood clusters (4402, 4404, 4406, 4408, 4410, 4414, 4412 and 4416). Each of these clusters is connected to the central node (4418) which acts as a controller. Each of the corner nodes interacts with external evolving applications (4420, 4426, 4422, 4424, 4430, 4428, 4432 and 4434). The inputs from these applications activate reconfiguration in the evolvable hardware nodes.

I claim:

1. A system for organizing multilayer integrated circuit (IC) nodes in a three dimensional (3D) system on a chip (SoC), comprising:
   35 3D hybrid IC nodes organized in a network configuration;
   wherein the nodes are organized to process data and instructions;
   wherein the IC nodes are hybrid semiconductors consisting of microprocessors, complex programmable logic devices, ASICs and memory components;
   wherein the IC nodes are linked to each other;
   wherein 34 of the IC nodes are organized in neighborhood clusters;
   wherein 1 of the IC nodes is a central controller node;
   wherein the configuration of each neighborhood cluster varies with specific tasks;
   wherein the 3D SoC receives signals from exogenous sources; and
   wherein the 3D SoC controls device applications.

2. A system of claim 1, wherein:
The configuration of the set of nodes in each neighborhood cluster changes its composition of nodes when activated by specific applications;
The minimum number of nodes in a neighborhood are two, including a corner node and an inside node;
The maximum number of nodes in a neighborhood is eight.

3. A system of claim 1, wherein:
One neighborhood cluster sends data and instructions to and receives data and instructions from other neighborhood clusters.

4. A system of claim 1, wherein:
Specific neighborhood clusters are inactive when applications are dormant.

5. A system of claim 1, wherein:
The SoC solves multi-objective optimization problems (MOOPs) by forwarding MOOPs to the several neighborhood clusters for simultaneous analysis until the problems are solved.

6. A system of claim 1, wherein:
The 3D SoC is used for DSP, embedded and multifunctional applications.

* * * * *